US012581722B2

(12) United States Patent
Higa et al.

(10) Patent No.: US 12,581,722 B2
(45) Date of Patent: Mar. 17, 2026

(54) SEMICONDUCTOR DEVICE INCLUDING IMPURITY REGIONS AND ELEMENT ISOLATION PORTION AND METHOD OF MANUFACTURING THE SAME

(71) Applicant: RENESAS ELECTRONICS CORPORATION, Tokyo (JP)

(72) Inventors: Yudai Higa, Tokyo (JP); Atsushi Sakai, Tokyo (JP); Yotaro Goto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 377 days.

(21) Appl. No.: 18/336,203

(22) Filed: Jun. 16, 2023

(65) Prior Publication Data

US 2024/0055301 A1 Feb. 15, 2024

(30) Foreign Application Priority Data

Aug. 10, 2022 (JP) ................................. 2022-127995

(51) Int. Cl.
H10D 84/03 (2025.01)
H10D 84/01 (2025.01)
H10D 84/83 (2025.01)

(52) U.S. Cl.
CPC ....... H10D 84/038 (2025.01); H10D 84/0149 (2025.01); H10D 84/0151 (2025.01); H10D 84/83 (2025.01)

(58) Field of Classification Search
CPC ......................... H10D 30/603; H10D 84/0151
See application file for complete search history.

(56) References Cited

U.S. PATENT DOCUMENTS

| 11,114,527 | B2 | 9/2021 | Koshimizu et al. | |
| 2011/0140202 | A1* | 6/2011 | Park ..................... | H10D 84/038 |
| | | | | 257/371 |
| 2019/0259749 | A1* | 8/2019 | Ishii ..................... | H10D 84/038 |
| 2020/0212176 | A1* | 7/2020 | Koshimizu ........ | H10D 30/0285 |

FOREIGN PATENT DOCUMENTS

JP 5487304 B2 5/2014

* cited by examiner

*Primary Examiner* — Daniel Whalen
(74) *Attorney, Agent, or Firm* — Rimon P.C.

(57) ABSTRACT

A semiconductor device includes a cell region in which MISFETs are formed, and a peripheral region surrounding the cell region in plan view. In the cell region and the peripheral region, an n-type impurity region is formed in a semiconductor substrate. In the semiconductor substrate, an element isolation portion, a p-type impurity region, and an n-type impurity region are formed in the peripheral region so as to surround the cell region in plan view. A p-type impurity region and an n-type impurity region are formed in the semiconductor substrate in the cell region so as to contact the impurity region. The element isolation portion is located in the impurity region and is spaced apart from a junction interface between the impurity region and the impurity region.

18 Claims, 21 Drawing Sheets

A-A CROSS SECTION

B-B CROSS SECTION

A-A CROSS SECTION

A-A CROSS SECTION

A-A CROSS SECTION

A-A CROSS SECTION

A-A CROSS SECTION

A-A CROSS SECTION

A-A CROSS SECTION

A-A CROSS SECTION

A-A CROSS SECTION

A-A CROSS SECTION

FIG. 21

FIRST EXAMINED EXAMPLE

A-A CROSS SECTION

SECOND EXAMINED EXAMPLE

A-A CROSS SECTION

SEMICONDUCTOR DEVICE INCLUDING IMPURITY REGIONS AND ELEMENT ISOLATION PORTION AND METHOD OF MANUFACTURING THE SAME

CROSS-REFERENCE TO RELATED APPLICATIONS

The disclosure of Japanese Patent Application No. 2022-127995 filed on Aug. 10, 2022, including the specification, drawings and abstract is incorporated herein by reference in its entirety.

BACKGROUND

The present disclosure relates to a semiconductor device and a method of manufacturing the same, and more particularly, to a semiconductor device including an impurity region surrounding a cell region and a method of manufacturing the same.

Semiconductor elements such as MISFET (Metal Insulator Semiconductor Field Effect Transistor) are formed on a semiconductor substrate provided in a semiconductor device. A noise-resistance is improved by forming an n-type impurity region at a deep position of the semiconductor substrate, and by electrically isolating the semiconductor elements and the semiconductor substrate by the n-type impurity region.

There is a disclose technique listed below.
[Patent Document 1] Japanese Patent No. 5487304

For example, as shown in FIG. 32 of Patent Document 1, a cell region including MISFETs is surrounded by a peripheral region in plan view. In the peripheral region, a p-type impurity region for supplying a voltage to a well region serving as a channel region of MISFET and an n-type impurity region for supplying a voltage to an impurity region for isolation are formed. The cell region is electrically isolated from the other semiconductor elements by the peripheral region.

SUMMARY

As shown in Patent Document 1, in a structure in which a voltage is supplied to the channel region and element isolation is performed by the impurity regions, if the structure of the cell region is changed, the existing structure of the peripheral region may not fit in some cases. That is, when the structure of the cell region is changed, it may be difficult to join the p-type impurity region to the channel region, and the breakdown voltage may be lowered in the vicinity of the peripheral region. Therefore, the reliability of the semiconductor device may be lowered.

Other objects and novel features will become apparent from the description of this specification and the accompanying drawings.

The typical ones of the embodiments disclosed in the present application will be briefly described as follows.

A semiconductor device according to one embodiment includes a cell region in which MISFETs are formed, and a peripheral region surrounding the cell region in plan view. The semiconductor device includes a first impurity region of a first conductivity type formed in a semiconductor substrate in the cell region and the peripheral region, an element isolation portion formed in the semiconductor substrate from an upper surface of the semiconductor substrate to a predetermined depth in the peripheral region so as to surround the cell region in plan view, a second impurity region of a second conductivity type opposite to the first conductivity type formed in the semiconductor substrate from the upper surface of the semiconductor substrate to a position deeper than the element isolation portion in the peripheral region so as to surround the cell region in plan view, a third impurity region of the first conductivity type formed in the semiconductor substrate from the upper surface of the semiconductor substrate to the first impurity region in the peripheral region so as to surround the second impurity region in plan view, a fourth impurity region of the second conductivity type formed in the semiconductor substrate in the cell region so as to contact the second impurity region and located on the first impurity region, and a fifth impurity region of the first conductivity type formed in the semiconductor substrate from the upper surface of the semiconductor substrate to the fourth impurity region in the cell region so as to contact the second impurity region. Here, the element isolation portion includes a trench formed in the semiconductor substrate and a dielectric film buried in the trench, and the element isolation portion is located in the second impurity region and spaced apart from a junction interface between the second impurity region and the fifth impurity region.

In a method of manufacturing a semiconductor device according to one embodiment, the semiconductor device includes a cell region in which MISFETs are formed and a peripheral region surrounding the cell region in plan view. The method includes: (a) forming a first impurity region of a first conductivity type in a semiconductor substrate in the cell region and the peripheral region; (b) forming an element isolation region in the semiconductor substrate from an upper surface of the semiconductor substrate to a predetermined depth in the peripheral region so as to surround the cell region in plan view; (c) forming a second impurity region of a second conductivity type opposite to the first conductivity type in the semiconductor substrate from the upper surface of the semiconductor substrate to a position deeper than the element isolation portion in the peripheral region so as to surround the cell region in plan view; (d) forming a third impurity region of the first conductivity type in the semiconductor substrate from the upper surface of the semiconductor substrate to the first impurity region in the peripheral region so as to surround the second impurity region in plan view; (e) forming a fourth impurity region of the second conductivity type in the semiconductor substrate in the cell region so as to contact the second impurity region and located on the first impurity region; (f) forming a fifth impurity region of the first conductivity type in the semiconductor substrate from the upper surface of the semiconductor substrate to the fourth impurity region in the cell region so as to contact the second impurity region. Here, the element isolation portion includes a trench formed in the semiconductor substrate and a dielectric film buried in the trench, and the element isolation portion is located in the second impurity region and spaced apart from a junction interface between the second impurity region and the fifth impurity region.

According to one embodiment, the reliability of semiconductor device can be improved.

BRIEF DESCRIPTION OF THE DRAWINGS

FIG. 21 is a cross-sectional view showing a manufacturing step of a semiconductor device in a first examined example.

DETAILED DESCRIPTION

Figure 1:
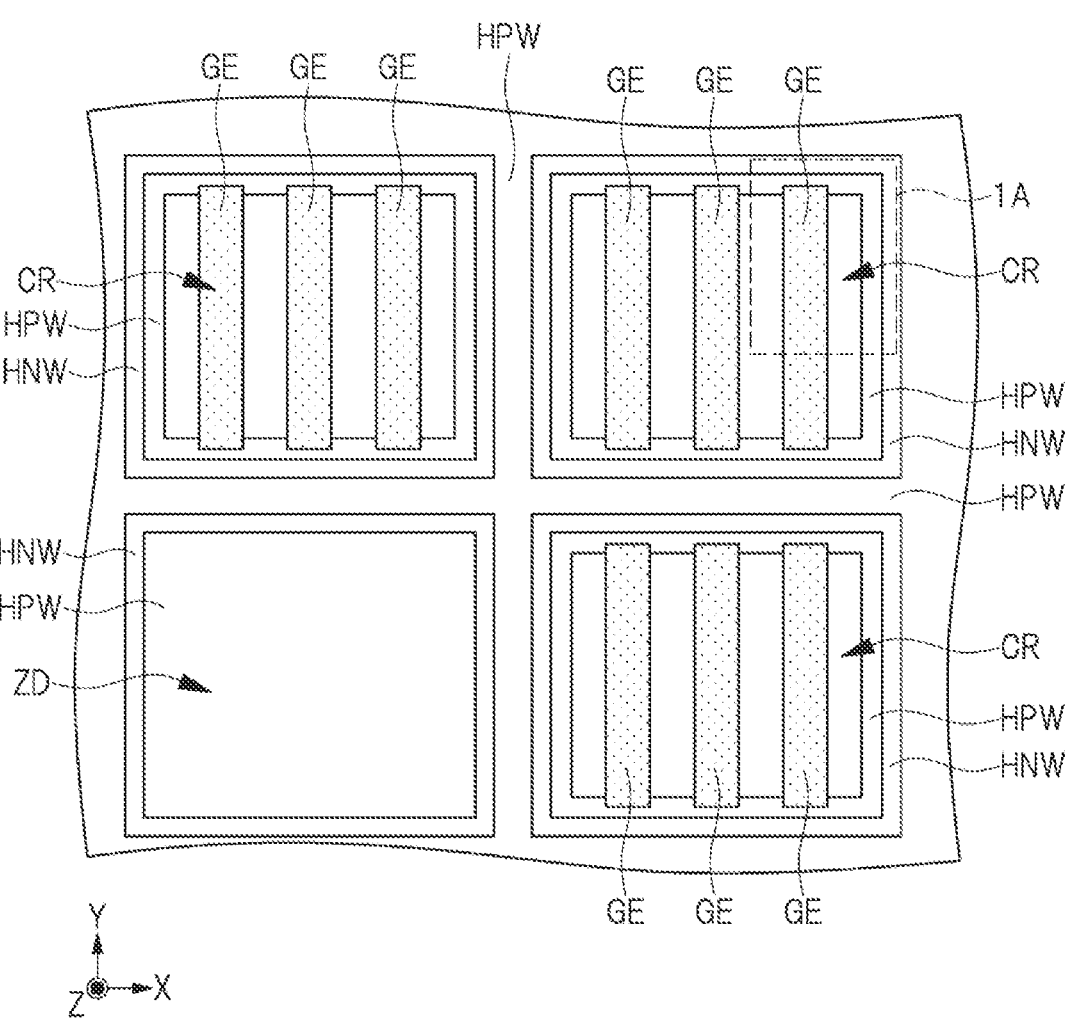
FIG. 1 is a plan view showing a portion of a semiconductor device in a first embodiment.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X direction, the Y direction, and the Z direction described in the present application intersect each other and are orthogonal to each other. In the present application, the Z direction is described as a vertical direction, a height direction, or a thickness direction of a certain structure. In addition, the expression "plan view" used in the present application means that the plane formed by the X direction and the Y direction is a "plane" and the "plane" is viewed from the Z direction.

First Embodiment

Structure of Semiconductor Device

Figure 2:
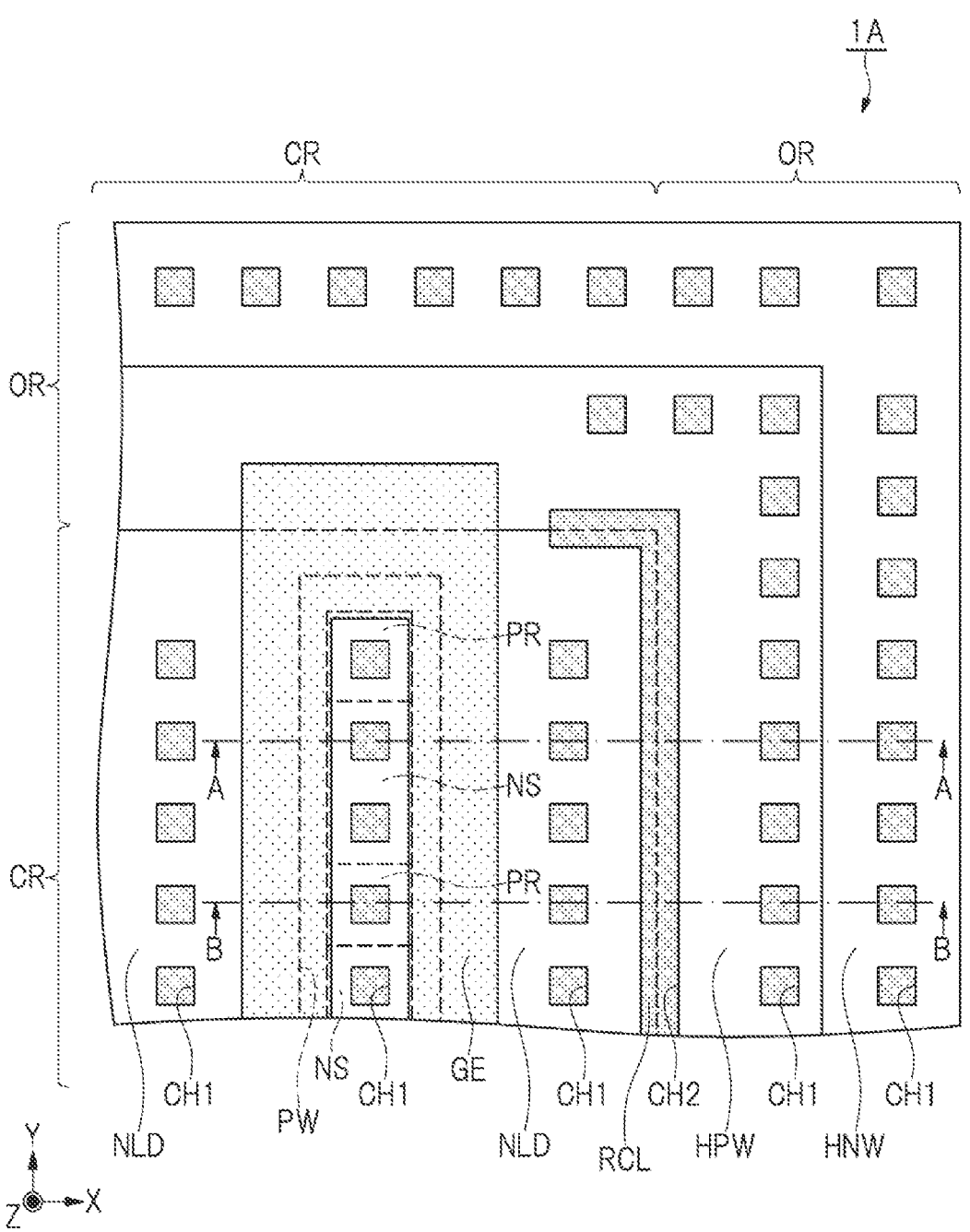
FIG. 2 is an enlarged plan view of the portion of the semiconductor device in the first embodiment.
Figure 3:
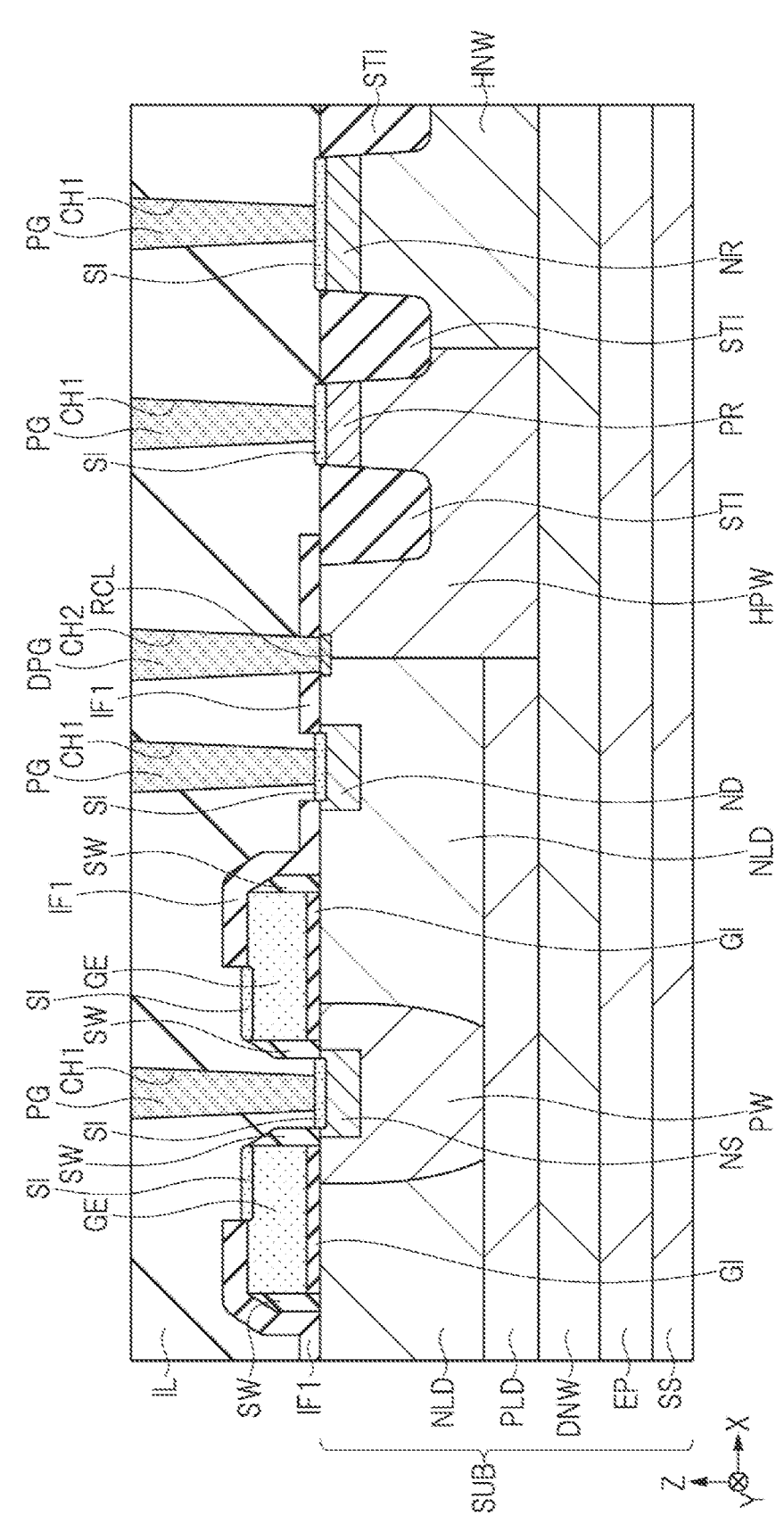
FIG. 3 is a cross-sectional view showing the semiconductor device in the first embodiment.
Figure 4:
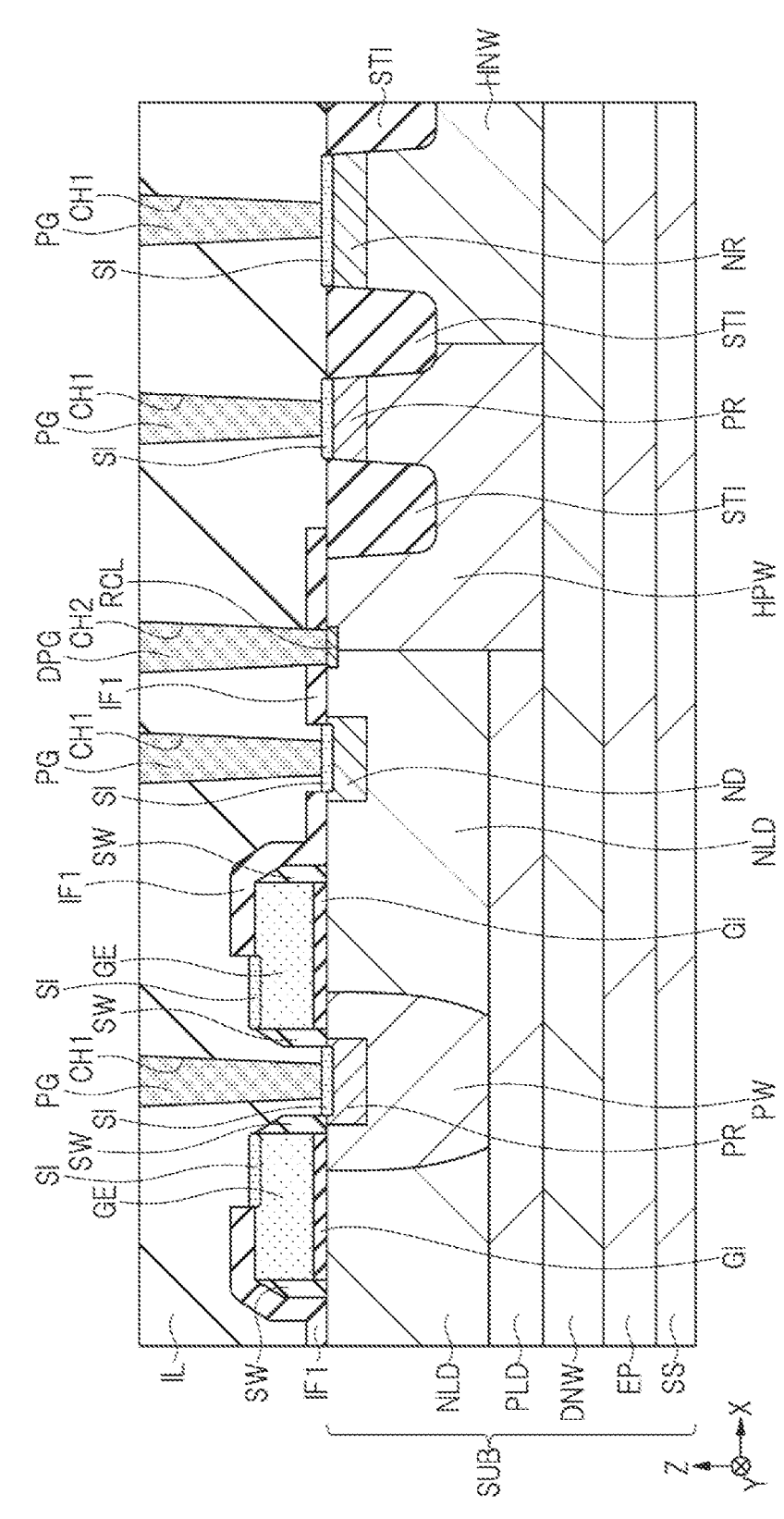
FIG. 4 is a cross-sectional view showing the semiconductor device in the first embodiment.

The structure of the semiconductor device in the first embodiment will be described below with reference to FIGS. 1 to 4. FIG. 1 is a plan view showing a portion of the semiconductor device (semiconductor chip) in the first embodiment. FIG. 2 is a plan view showing an enlarged region 1A shown in FIG. 1. FIG. 3 is a cross-sectional view along line A-A shown in FIG. 2. FIG. 4 is a cross-sectional view along line B-B shown in FIG. 2.

As shown in FIG. 1, the semiconductor device includes various semiconductor elements such as MISFETs, Zener diodes ZD, resistive elements, and capacitive elements. Here, a region in which MISFETs are formed is shown as a cell region CR. The semiconductor elements are surrounded by a n-type impurity region HNW in plan view. Further, the semiconductor elements are electrically isolated from each other by the impurity region HNW and an n-type impurity region DNW which will be described later in a cross-sectional view.

As shown in FIG. 2, the semiconductor device includes a cell region CR and a peripheral region OR surrounding the cell region CR in plan view. The MISFETs in the cell region CR configure, for example, a part of a DC/DC converter or a power supply IC. Each of the MISFETs has a gate electrode GE extending in the Y direction.

In the peripheral region OR, a p-type impurity region HPW that surrounds the cell region CR in plan view and extends in the X direction and the Y direction is formed. In the peripheral region OR, the n-type impurity region HNW that surrounds the impurity region HPW in plan view and extends in the X direction and the Y direction is formed.

As shown in FIGS. 3 and 4, a semiconductor substrate SUB is formed of a laminated body of a support substrate SS made of p-type silicon substrate and a p-type semiconductor layer (epitaxial layer) EP formed on the support substrate SS by an epitaxial growth method. Various impurity regions are formed in the semiconductor layer EP, but it is explained that various impurity regions are formed in the semiconductor substrate SUB for the sake of simplicity of explanation.

In the cell region CR and the peripheral region OR, the n-type impurity region DNW is formed in the semiconductor substrate SUB. This impurity region DNW isolates the MISFETs in the cell region CR from the support substrate SS to increase the noise-resistance.

First, the structure in the peripheral region OR will be described.

In the peripheral region OR, an element isolation portion STI is formed in the semiconductor substrate SUB from an upper surface of the semiconductor substrate SUB to a predetermined depth. The element isolation portion STI includes a trench formed in the semiconductor substrate SUB and a dielectric film such as a silicon oxide film buried in the trench.

In the peripheral region OR, the p-type impurity region HPW and the n-type impurity region HNW are formed in the semiconductor substrate SUB from the upper surface of the semiconductor substrate SUB to a position deeper than the element isolation portion STI. The impurity region HNW is formed in the semiconductor substrate SUB from the upper surface of the semiconductor substrate SUB to the impurity region DNW. In the impurity region HPW surrounded by the element isolation portion STI, a high-concentration diffusion region PR is formed, and in the impurity region HNW surrounded by the element isolation portion STI, a high-concentration diffusion region NR is formed.

Next, the structure in the cell region CR will be described.

A p-type impurity region PLD is formed in the semiconductor substrate SUB in the cell region CR so as to be located on the impurity region DNW and to contact the impurity region HPW. Further, in the cell region CR, an n-type impurity region NLD and a p-type impurity region PW are formed in the semiconductor substrate SUB from the upper surface of the semiconductor substrate SUB to the impurity region PLD so as to contact the impurity region HPW.

As shown in FIGS. 3 and 4, an n-type source region NS and the p-type high-concentration diffusion region PR are formed in the impurity region PW. As shown in FIG. 2, an opening portion is provided near the central of the gate electrode GE, and the source region NS and the high-concentration diffusion region PR are formed in the opening portion.

An n-type drain region ND is formed in the impurity region NLD. The impurity region PW is surrounded by the impurity region NLD in plan view. The gate electrode GE is formed on the impurity region PW and the impurity region NLD via a gate dielectric film GI. The gate dielectric film GI is, for example, a silicon oxide film. The gate electrode GE is, for example, a polycrystalline silicon film in which n-type impurities are implanted.

The source region NS configures a source region of the MISFET. The drain region ND forms a part of the drain region of the MISFET together with the impurity region NLD. The impurity region PW located directly below the gate electrode GE serves as a channel region of the MISFET.

Sidewall spacers SW are formed on both side surfaces of the gate electrode GE. The sidewall spacers SW are, for example, laminated films of a silicon oxide film and a silicon nitride film formed on the silicon oxide film. A dielectric film IF1 having a pattern opening a part of the upper surface of the semiconductor substrate SUB and a part of the gate electrode GE is formed on the upper surface of the semiconductor substrate SUB so as to cover a part of the gate electrode GE and the sidewall spacers SW. The dielectric film IF1 is, for example, a silicon oxide film.

Silicide films SI are formed in regions exposed from the dielectric film IF1. That is, the silicide films SI are formed on an upper surface of each of a part of the gate electrode GE, the source region NS, the drain region ND, the high-concentration diffusion region PR, and the high-concentration diffusion region NR. The source region NS and the high-concentration diffusion region PR in the cell region CR are electrically connected by the same silicide film SI. The silicide film SI is, for example, a cobalt silicide (CoSi$_2$) film, a nickel silicide (NiSi) film, or a nickel platinum silicide (NiPtSi) film.

In the cell region CR and the peripheral region OR, an interlayer dielectric film IL is formed on the upper surface of the semiconductor substrate SUB. The interlayer dielectric film IL is, for example, a silicon oxide film. The interlayer dielectric film IL may be a laminated film of a silicon nitride film and a silicon oxide film formed on the silicon nitride film.

Contact holes CH1 are formed in the interlayer dielectric film IL. Plugs PG are formed in the contact holes CH1. The plugs PG are formed of, for example, laminated films of a barrier metal film and a conductive film formed on the barrier metal film. The barrier metal film is, for example, a laminated film of a titanium film and a titanium nitride film, and the conductive film is, for example, a tungsten film.

The contact holes CH1 are located on the upper surfaces of the source region NS, the drain region ND, the high-concentration diffusion region PR, and the high-concentration diffusion region NR. Although not shown here, wirings connected to the plugs PG are formed on the interlayer dielectric film IL. Predetermined voltages are supplied to the source region NS, the drain region ND, the high-concentration diffusion region PR, and the high-concentration diffusion region NR from the wirings.

Since the high-concentration diffusion region NR, the impurity region HNW, and the impurity region DNW are conductive as n-type impurity regions, they are fixed to the same potential. Since the high-concentration diffusion region PR, the impurity region HPW, the impurity region PLD, and the impurity region PW are conductive as p-type impurity regions, they are fixed to the same potential. Since the drain region ND and the impurity region NLD are conductive as n-type impurity regions, they are fixed to the same potential.

Although not shown here, the contact hole CH1 and the plug PG are also formed on the upper surface of the gate electrode GE on which the silicide film SI is formed. A gate voltage is supplied to the gate electrode GE via the plug PG.

Further, a slit-shaped contact hole CH2 is formed in the interlayer dielectric film IL. A dummy plug DPG is formed in the contact hole CH2. The dummy plug DPG is formed of a barrier metal film and a conductive film similar to those of the plug PG. The contact hole CH2 and the dummy plug DPG are formed on the upper surfaces of the impurity region HPW and the impurity region NLD and across the junction interface between the impurity region HPW and the impurity region NLD.

A recombination promoting layer RCL is formed on the upper surface of the semiconductor substrate SUB located at the bottom portion of the contact hole CH2. The recombination promoting layer RCL in the first embodiment is a crystal defect layer formed by a plasma etching process performed when the contact hole CH2 is formed. As shown in FIG. 2, the contact hole CH2 and the recombination promoting layer RCL extend at least in the Y direction and also in the X direction along the junction interface.

The impurity concentration of the n-type impurity region DNW is, for example, $1 \times 10^{16}$ cm$^{-3}$ to $1 \times 10^{17}$ cm$^{-3}$. The impurity concentration of the p-type impurity region HPW is, for example, $5 \times 10^{16}$ cm$^{-3}$ to $5 \times 10^{17}$ cm$^{-3}$. The impurity concentration of the n-type impurity region HNW is, for example, $1 \times 10^{16}$ cm$^{-3}$ to $1 \times 10^{17}$ cm$^{-3}$. The impurity concentration of the p-type impurity region PLD is, for example, $1 \times 10^{16}$ cm$^{-3}$ to $8 \times 10^{16}$ cm$^{-3}$. The impurity concentration of the n-type impurity region NLD is, for example, $1 \times 10^{16}$ cm$^{-3}$ to $5 \times 10^{16}$ cm$^{-3}$. The impurity concentration of the p-type impurity region PW is, for example, $5 \times 10^{17}$ cm$^{-3}$ to $5 \times 10^{18}$ cm$^{-3}$. The impurity concentration of each of the n-type high-concentration diffusion region NR, the n-type source region NS, and the n-type drain region ND is, for example, $1 \times 10^{19}$ cm$^{-3}$ to $1 \times 10^{21}$ cm$^{-3}$. The impurity concentration of the p-type high-concentration diffusion region PR is, for example, $1 \times 10^{19}$ cm$^{-3}$ to $1 \times 10^{21}$ cm$^{-3}$.

The diameters of the contact holes CH1 (the widths in the X direction and the widths in the Y direction) are, for example, 0.16 μm or more and 0.20 μm or less. Further, in a direction orthogonal to the extending direction of the contact hole CH2, the contact hole CH2 has a width of, for example, 0.16 μm or more and 0.20 μm or less.

The main features of the first embodiment are that the element isolation portion STI is located in the impurity region HPW and is spaced apart from the junction interface between the impurity region HPW and the impurity region NLD, and that the recombination promoting layer RCL is formed across the junction interface. However, such features will be described with reference to an examined example after manufacturing method of the semiconductor device is described.

Manufacturing Method of Semiconductor Device

The manufacturing method of the semiconductor device in the first embodiment will be described below using the respective manufacturing steps shown in FIGS. 5 to 11. In the following, explanation will be made based on A-A cross section of FIG. 3.

Figure 5:
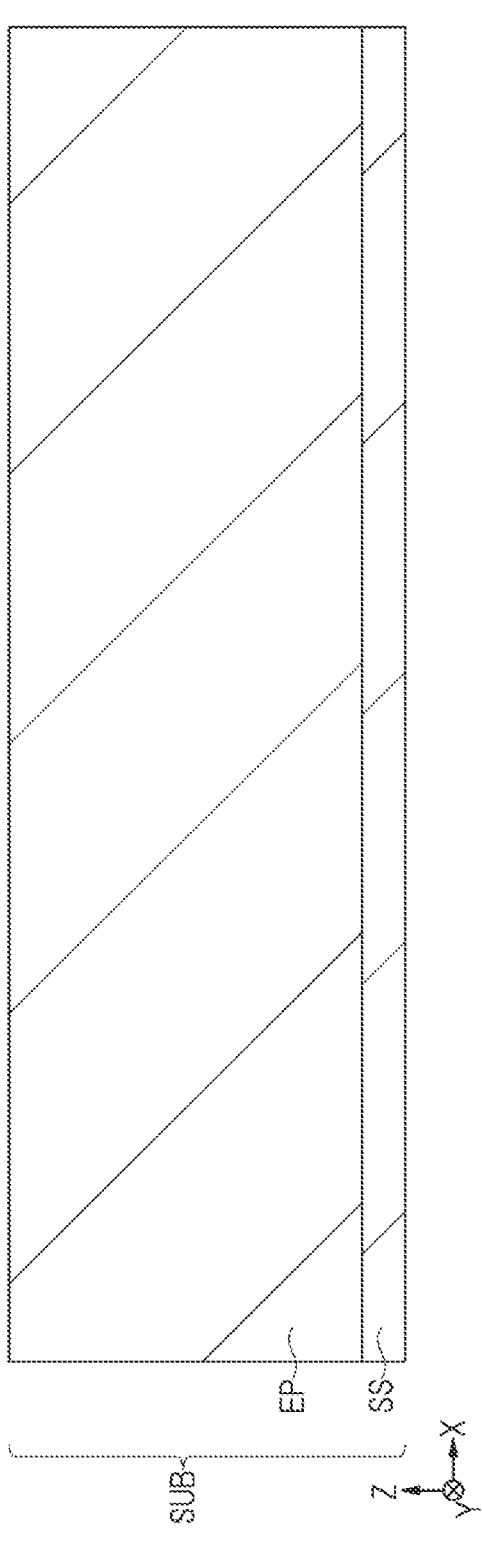
FIG. 5 is a cross-sectional view showing a manufacturing step of the semiconductor device in the first embodiment.

As shown in FIG. 5, the p-type support substrate SS is first prepared. The support substrate SS is made of silicon. Next, the p-type semiconductor layer EP is formed on the support substrate SS by an epitaxial growth method. As a result, the semiconductor substrate SUB that is a laminated body of the support substrate SS and the semiconductor layer EP is formed.

Figure 6:
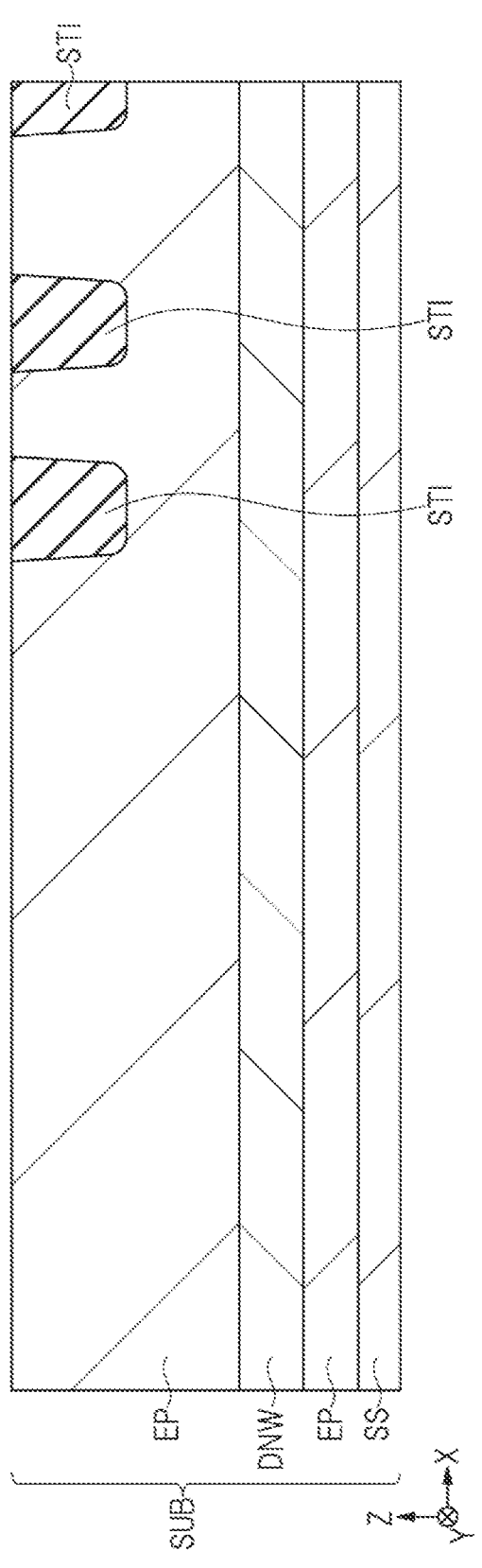
FIG. 6 is a cross-sectional view showing a manufacturing step subsequent to FIG. 5.

As shown in FIG. 6, in the cell region CR and the peripheral region OR, the n-type impurity region DNW is formed in the semiconductor substrate SUB (in the semiconductor layer EP) by a photolithography technique and an ion-implantation method.

Further, in the peripheral region OR, the element isolation portion STI is formed in the semiconductor substrate SUB from the upper surface of the semiconductor substrate SUB to a predetermined depth so as to surround the cell region CR in plan view. First, a trench is formed in the semiconductor substrate SUB by the photolithography technique and an etching process. Next, a dielectric film such as a silicon oxide film is formed on the semiconductor substrate SUB so as to fill the trench. Next, the dielectric film on the semiconductor substrate SUB is removed by a polishing process using a CMP method, and the dielectric film is left in the trench. In this manner, the element isolation portion STI formed of the trench and the dielectric film is formed.

Figure 7:
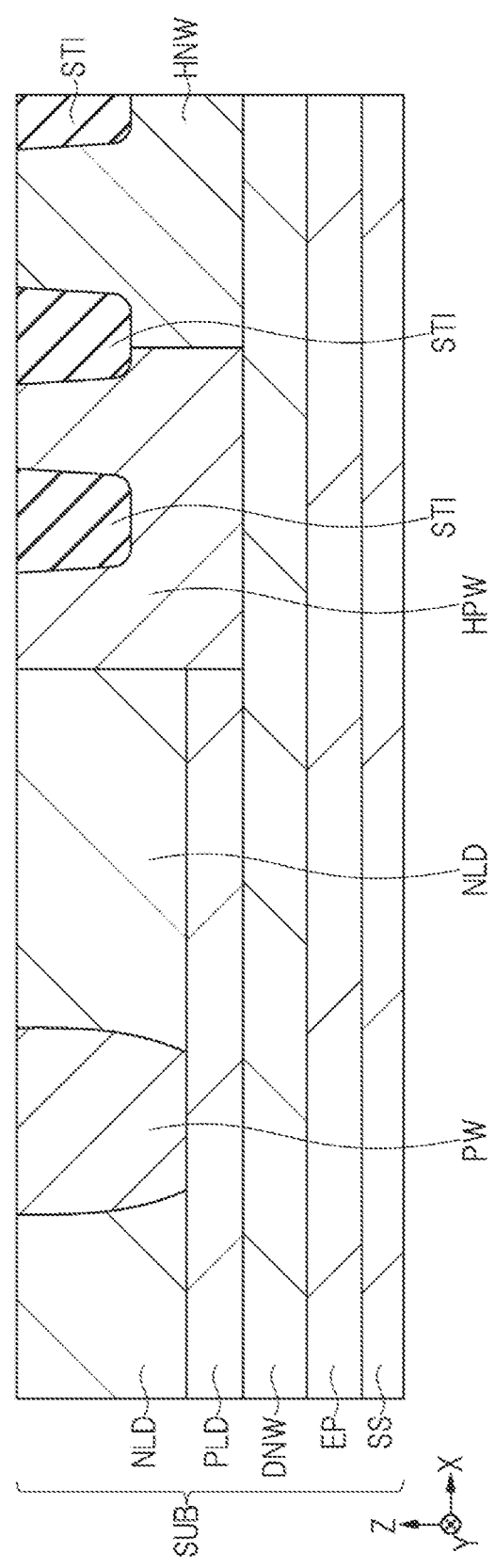
FIG. 7 is a cross-sectional view showing a manufacturing step subsequent to FIG. 6.

As shown in FIG. 7, in the peripheral region OR, the p-type impurity region HPW is formed in the semiconductor substrate SUB from the upper surface of the semiconductor substrate SUB to a position deeper than the element isolation portion STI by the photolithography technique and the ion-implantation method. Next, in the peripheral region OR, the n-type impurity region HNW is formed in the semiconductor substrate SUB from the upper surface of the semiconductor substrate SUB to the impurity region DNW by the photolithography technique and the ion-implantation method.

Next, the p-type impurity region PLD is formed in the semiconductor substrate SUB in the cell region CR by the photolithography technique and the ion-implantation method so as to be located on the impurity region DNW and to contact the impurity region HPW. Next, in the cell region CR, the n-type impurity region NLD is formed in the semiconductor substrate SUB from the upper surface of the semiconductor substrate SUB to the impurity region PLD by the photolithography technique and the ion-implantation method so as to contact the impurity region HPW. Next, in the cell region CR, a p-type impurity region PW is formed in the semiconductor substrate SUB from the upper surface of the semiconductor substrate SUB to the impurity region PLD by the photolithography technique and the ion-implantation method.

Note that the forming order of the impurity region HPW, the impurity region HNW, the impurity region PLD, the impurity region NLD, and the impurity region PW is not limited to the above-described order.

Figure 8:
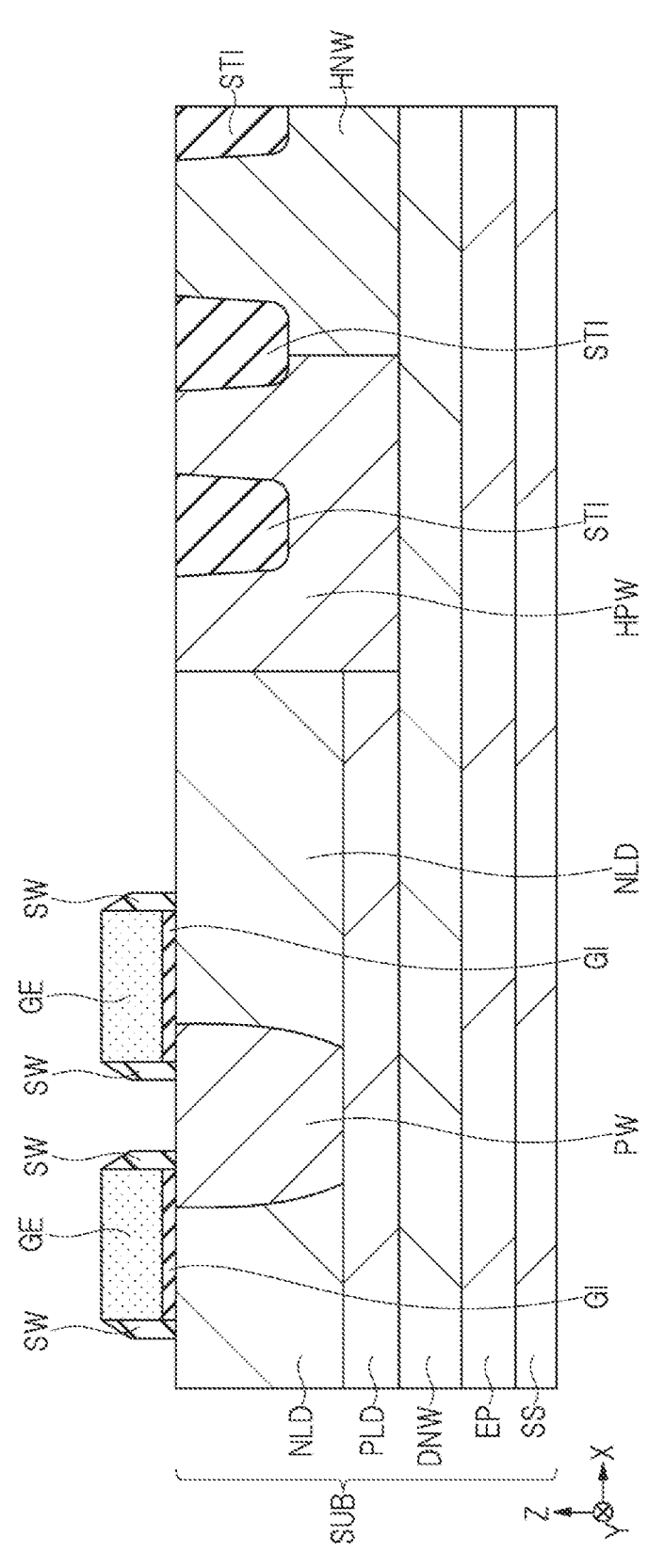
FIG. 8 is a cross-sectional view showing a manufacturing step subsequent to FIG. 7.

As shown in FIG. 8, the gate dielectric film GI formed of, for example, silicon oxide is formed on the impurity region PW and the impurity region NLD by, for example, a thermal oxidation method or a CVD method. Next, a polycrystalline silicon film into which, for example, n-type impurities are implanted is formed on the impurity region PW and the impurity region NLD via the gate dielectric film GI by, for example, the CVD method. Thereafter, the polycrystalline silicon film is patterned to form the gate electrode GE on the gate dielectric film GI.

Next, a dielectric film such as a silicon nitride film is formed on the semiconductor substrate SUB by, for example, the CVD method so as to cover the gate electrode GE. Next, an anisotropic etching process is performed on the dielectric film to form the sidewall spacers SW on the side surfaces of the gate electrode GE.

Figure 9:
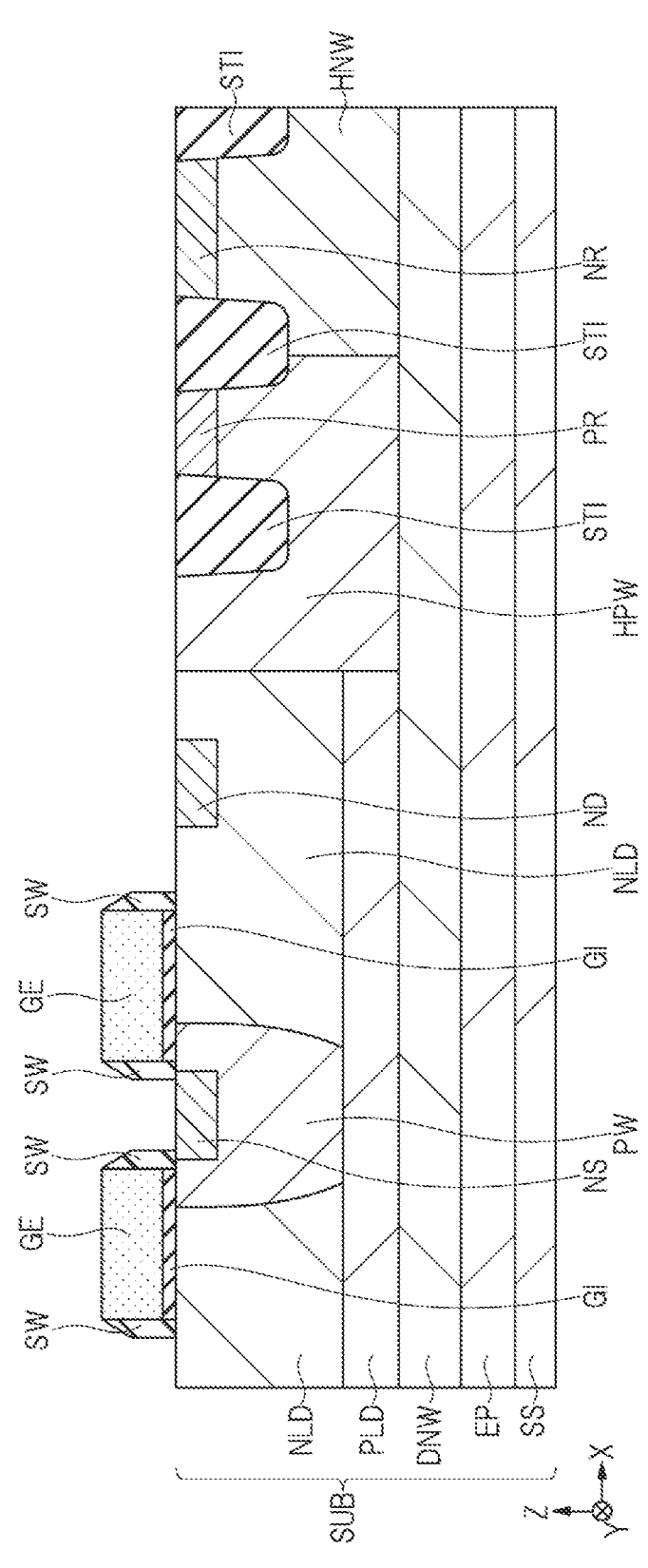
FIG. 9 is a cross-sectional view showing a manufacturing step subsequent to FIG. 8.

As shown in FIG. 9, in the cell region CR, the source region NS is formed in the impurity region PW and the drain region ND is formed in the impurity region NLD by the photolithography technique and the ion-implantation method. At this time, in the peripheral region OR, the high-concentration diffusion region NR is formed in the impurity region HNW. Next, the high-concentration diffusion region PR is formed in the impurity region HPW in the peripheral region OR by the photolithography technique and the ion-implantation method. At this time, the high-concentration diffusion region PR shown in FIG. 4 is also formed in the impurity region PW in the cell region CR. The high-concentration diffusion region PR may be formed prior to the source region NS, the drain region ND, and the high-concentration diffusion region NR.

Figure 10:
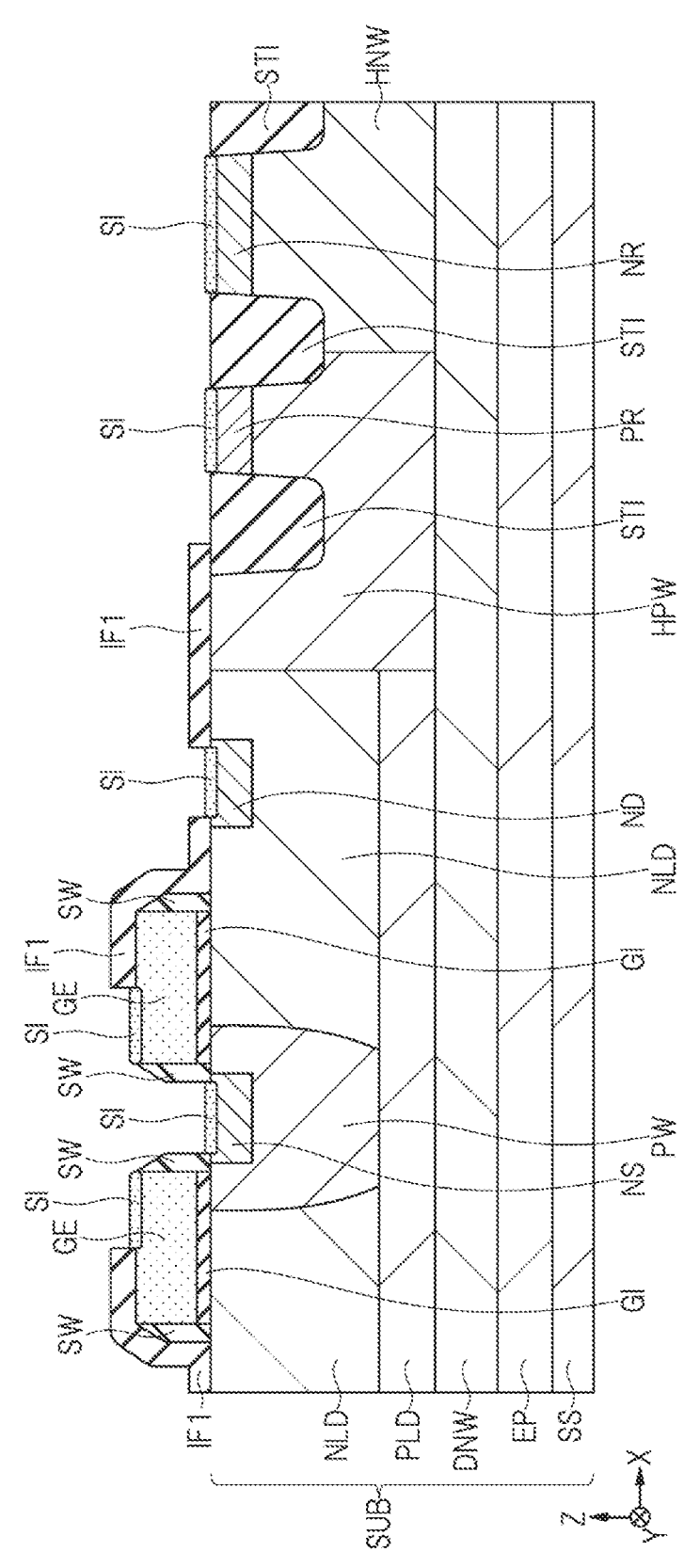
FIG. 10 is a cross-sectional view showing a manufacturing step subsequent to FIG. 9.

As shown in FIG. 10, the dielectric film IF1 such as a silicon oxide film is formed on the semiconductor substrate SUB by, for example, the CVD method so as to cover the gate electrode GE. Next, the dielectric film IF1 is patterned by the photolithography technique and the etching process. As a result, a pattern opening a part of the upper surface of the semiconductor substrate SUB and a part of the upper surface of the gate electrode GE is formed.

Next, the silicide film SI is formed on a part of the upper surface of the semiconductor substrate SUB and a part of the upper surface of the gate electrode GE exposed from the dielectric film IF1 by salicide technique. First, a metal film is formed on the dielectric film IF1, the upper surface of the semiconductor substrate SUB, and the upper surface of the gate electrode GE by, for example, a sputtering method. The metal film is made of, for example, cobalt, nickel, or a nickel platinum alloy. Next, the semiconductor substrate SUB is subjected to a first heat treatment at about 300° C. to 400° C. and then subjected to a second heat treatment at about 600° C. to 700° C. to react the semiconductor substrate SUB and the gate electrode GE with the metal film. As a result, the silicide films SI are formed on the upper surface of the semiconductor substrate SUB and the upper surface of the gate electrode GE exposed from the dielectric film IF1. Thereafter, the unreacted metal film is removed.

Figure 11:
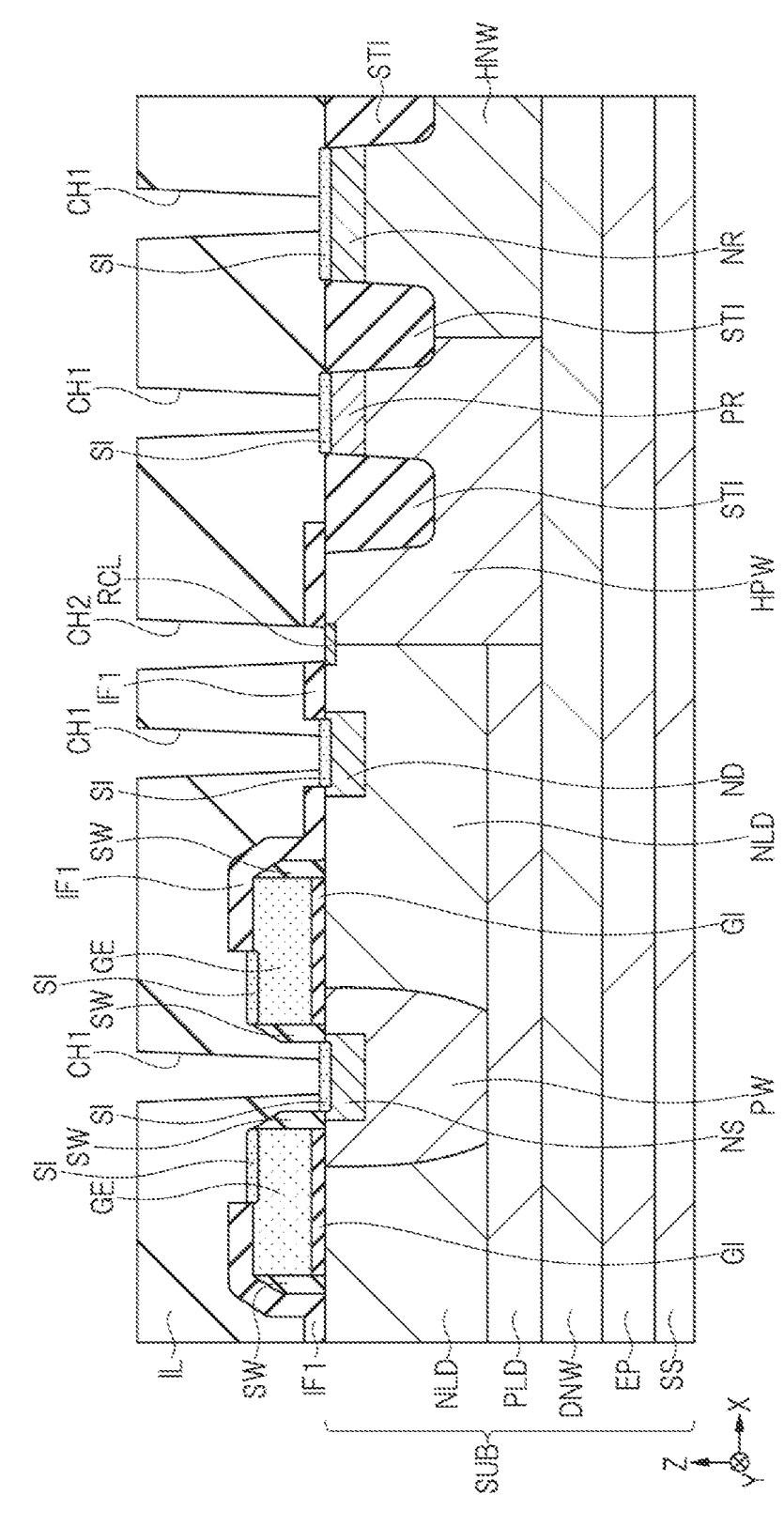
FIG. 11 is a cross-sectional view showing a manufacturing step subsequent to FIG. 10.

As shown in FIG. 11, in the cell region CR and the peripheral region OR, the interlayer dielectric film IL is formed on the semiconductor substrate SUB by, for example, the CVD method. The interlayer dielectric film IL may be a single-layer film of a silicon oxide film, or may be a laminated film of a silicon nitride film and a silicon oxide film on the silicon nitride film.

Next, the contact holes CH1, CH2 are formed in the interlayer dielectric film IL by a plasma etching process. The contact holes CH1 are located on the respective upper surfaces of the source region NS, the drain region ND, the high-concentration diffusion region PR, and the high-concentration diffusion region NR, and reach the respective silicide films SI. The contact hole CH2 is formed on the upper surface of each of the impurity region HPW and the impurity region NLD and across the junction interface between the impurity region HPW and the impurity region NLD.

As a result of the plasma etching process, the crystal defect layer is formed on the upper surface of the semiconductor substrate SUB located at the bottom portion of the contact hole CH2. This crystal defect layer serves as the recombination promoting layer RCL.

Next, the plugs PG are formed in the contact holes CH1, and the dummy plug DPG is formed in the contact hole CH2, whereby the semiconductor device shown in FIG. 3 is manufactured.

In order to form the plugs PG and the dummy plug DPG, first, a barrier metal film is formed on the interlayer dielectric film IL including the inside of the contact holes CH1 and the inside of the contact hole CH2 by, for example, the sputtering method. The barrier metal film is, for example, a laminated film of a titanium film and a titanium nitride film.

Next, a conductive film such as a tungsten film is formed on the barrier metal film by, for example, the CVD method. Next, the conductive film and the barrier metal film formed outside the contact holes CH1 and outside the contact hole CH2 are removed by the plasma etching process or the polishing process using a CMP process.

First Examined Example and Main Features of First Embodiment

The semiconductor device in the first examined example studied by the inventors will be described with reference to FIG. 21 below. In the semiconductor device in the first examined example, the element isolation portion STI is formed across the junction interface between the impurity region HPW and the impurity region NLD.

Figure 21:
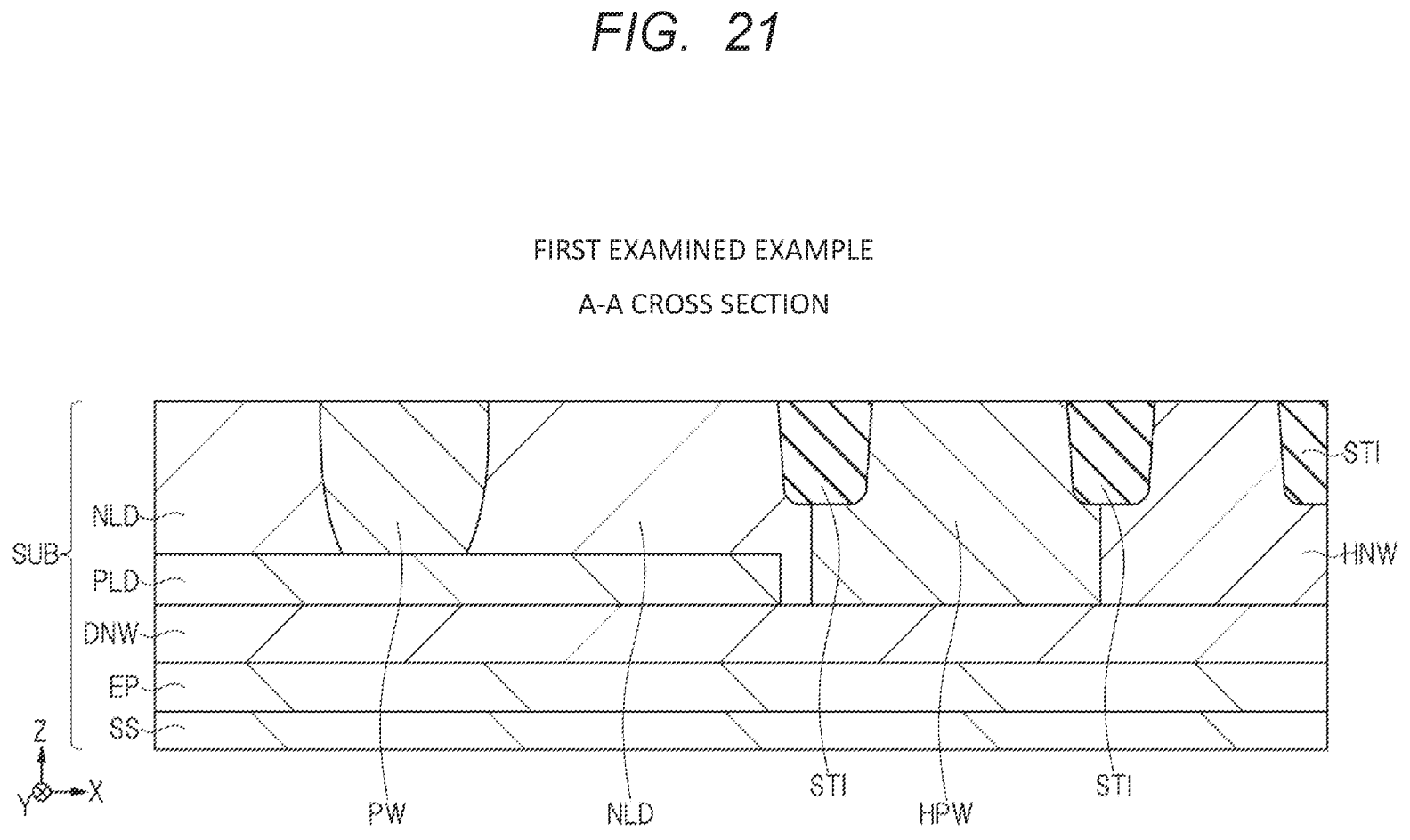

FIG. 21 shows a manufacturing step corresponding to FIG. 7. When the p-type impurity region PLD is formed, the ion-implantation is performed, but ions tend to be difficult to reach directly below the element isolation portion STI. Therefore, there is a possibility that the impurity region PLD is not formed or the impurity concentration of the impurity region PLD becomes remarkably low in the vicinity of the contact point with the impurity region HPW. That is, the impurity region PLD may not be electrically conductive to the impurity region HPW. As a result, the potential supplied to the high-concentration diffusion region PR and the impurity region HPW is not transmitted to the impurity region PLD and the impurity region PW.

In the first embodiment, as shown in FIG. 3, the element isolation portion STI is located in the impurity region HPW so as to be spaced apart from the junction interface between the impurity region HPW and the impurity region STI. Therefore, the impurity region PLD can be reliably contacted with the impurity region HPW, and a power supply path from the high-concentration diffusion region PR to the impurity region PW is secured, so that the reliability of semiconductor device can be improved.

Second Examined Example and Main Features of First Embodiment

The semiconductor device in the second examined example studied by the inventors will be described with reference to FIG. 22 below. The semiconductor device in the second examined example is approximately the same as the semiconductor device in the first embodiment except that the recombination promoting layer RCL is not formed.

There is a test for measuring the parasitic breakdown voltage BVceo as one test for the reliability of the semiconductor device. When the parasitic breakdown voltage BVceo starts to decrease, which may cause device breakdown during the transient operation of semiconductor device, protective-circuit operation, the latch-up, and the like.

Therefore, it is required to provide a technique capable of suppressing a decrease in the parasitic breakdown voltage BVceo.

Figure 22:
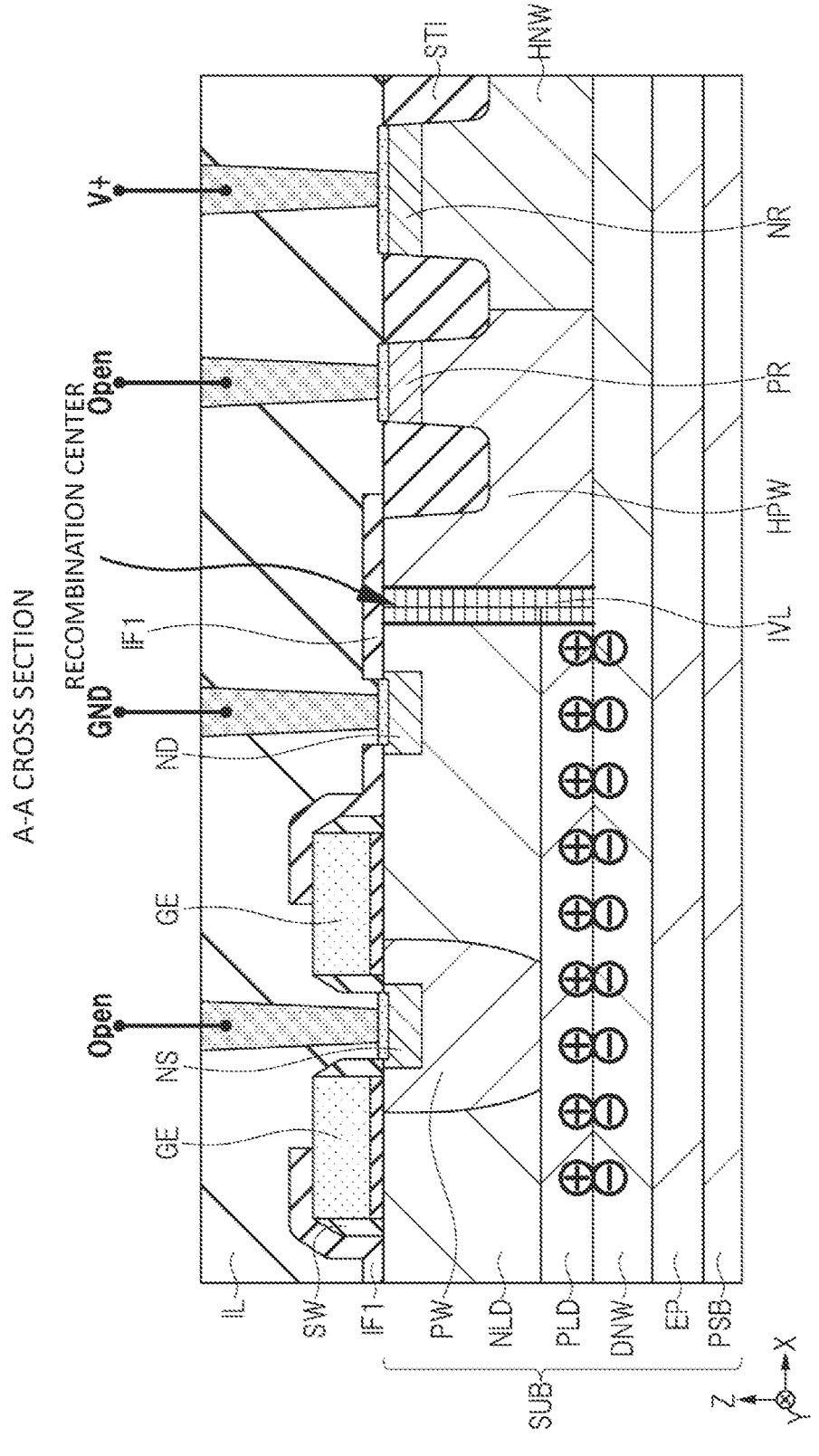
FIG. 22 is a cross-sectional view showing a semiconductor device in a second examined example.

As shown in FIG. 22, in this measuring test, the source region NS and the high-concentration diffusion region PR are not supplied with voltage (OPEN). Therefore, the p-type impurity regions PW, PLD, HPW are not supplied with a voltage. Further, a reference voltage (GND) is supplied to the impurity region NLD via the drain region ND. Also, a positive voltage (V+) is supplied to the n-type impurity region DNW via the high-concentration diffusion region NR and the impurity region HNW.

The inventors of the present application have found out that the parasitic breakdown voltage BVceo starts to decrease when the total value of the gate widths of the MISFETs formed in the cell region CR reaches a certain value.

The following discussion is a mechanism found by the inventors of the present application by conducting a search using TCAD. When a positive voltage is applied to the impurity region DNW, electron-hole pairs are generated at the interface between the impurity region DNW and the impurity region PLD. Since the source region NS and the high-concentration diffusion region PR are in "OPEN" state, holes are sequentially accumulated in the impurity region PLD. The accumulated holes raise the potential of the impurity region PLD. Eventually, the impurity region PLD and the drain region ND connected to the "GND" are quasi-biased, and the parasitic bipolar is activated. The parasitic bipolar causes a decrease in the parasitic breakdown voltage BVceo.

The relationship between the total value [μm] of the gate widths W of the gate electrodes GE and the decrease in the parasitic breakdown voltage BVceo will be described below with reference to FIG. 12. The inventors have now found out through experimentation that recombination centers are active in the peripheral region OR.

Figure 12:
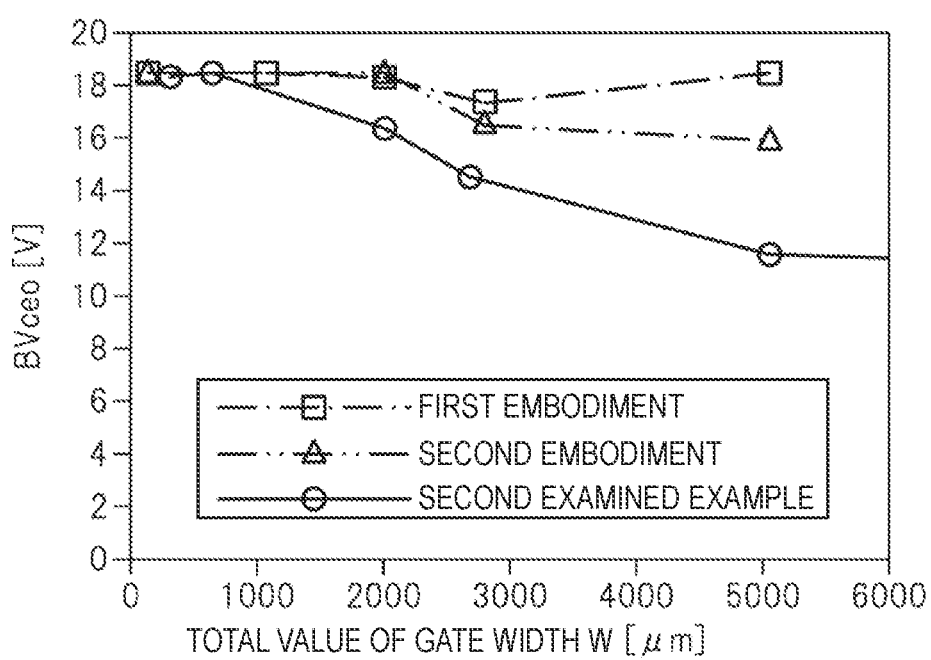
FIG. 12 is a graph showing a data of experiments conducted by the present inventors.

As shown in FIG. 12, when the total value of the gate widths W is small, for example, when the total value of the gate widths W is smaller than 1000 μm, most of the holes accumulated in the impurity region PLD are consumed by recombination in the peripheral region OR. Therefore, since the impurity region PLD and the drain region ND are short-circuited by the junction breakdown voltage earlier than they are quasi-biased, the parasitic breakdown voltage BVceo is fixed at about 18 V.

On the other hand, when the total value of the gate widths W is large, for example, when the total value of the gate widths W is 1000 μm or more, the amount of electron-hole pairs generated at the interface between the impurity region DNW and the impurity region PLD is larger than the amount of holes recombined in the peripheral region OR. Therefore, in the second examined example, the parasitic breakdown voltage BVceo decreases as the total value of the gate widths W increases.

Based on the above discussion, the present inventors have devised a configuration in which a decrease in the parasitic breakdown voltage BVceo can be suppressed by promoting recombination in the vicinity of the boundary between the cell region CR and the peripheral region OR.

Here, the term "recombination" means that holes and electrons are combined and disappear. The recombination occurs mainly in a depletion layer IVL formed at the interface between the p-type region rich in holes and the n-type region rich in electrons. Therefore, in order to promote recombination, it is effective to form the recombination promoting layer RCL on the upper surface of the semiconductor substrate SUB in which the depletion layer IVL is formed. Further, the larger the area where the recombination promoting layer RCL overlaps with the depletion layer IVL is, the more effective the reduction in the parasitic breakdown voltage BVceo is suppressed.

Therefore, in the first embodiment, as shown in FIG. 3, the recombination promoting layer RCL for recombining electrons and holes is formed on each of the upper surface of the impurity region HPW and the impurity region NLD so as to be across the junction interface between the impurity region HPW and the impurity region NLD. As described above, the recombination promoting layer RCL in the first embodiment is a crystal defect layer by a plasma etching process. This crystal defect layer acts as a midgap level and promotes hole recombination.

As shown in FIG. 12, in the examined example, when the total value of the gate widths W becomes around 1000 μm, the parasitic breakdown voltage BVceo starts to decrease, when the total value of the gate widths W becomes 5000 μm or more, the parasitic breakdown voltage BVceo decreases to about 12 V, but in the first embodiment, the decrease in the parasitic breakdown voltage BVceo is suppressed even if the total value of the gate widths W is 5000 μm or more. Therefore, according to the first embodiment, the reliability of the semiconductor device can be improved.

Figure 13:
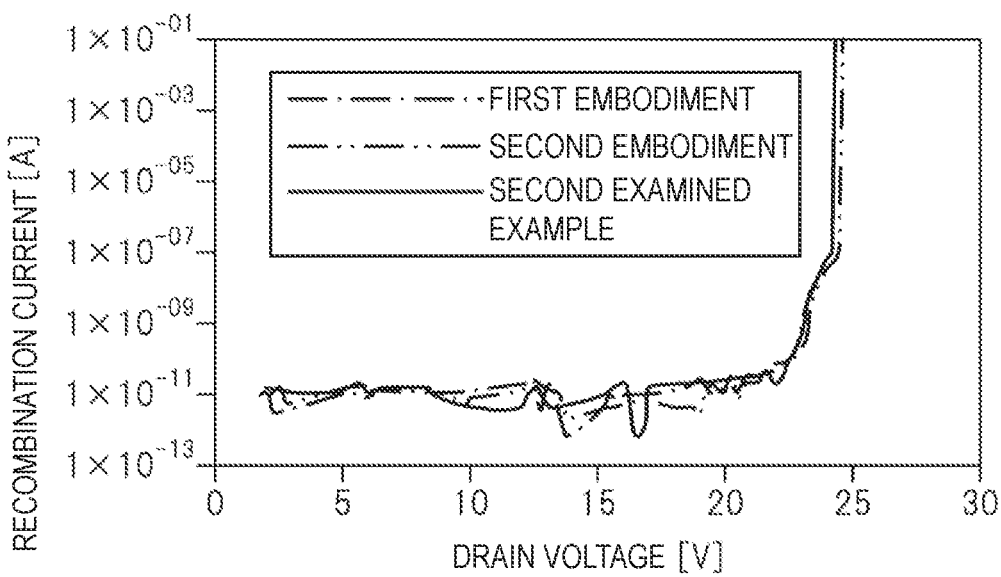
FIG. 13 is a graph showing a data of experiments conducted by the present inventors.

By providing the recombination promoting layer RCL, the recombination current may flow as an off-leakage current between the drain region ND and the source region NS as a result of suppressing a decrease in the parasitic breakdown voltage BVceo. FIG. 13 is an experimental result of the off-leakage current of the present inventors. As shown in FIG. 13, between the second examined example and the first embodiment, there was almost no increase in the off-leakage current, and it was just in a measurement error level.

Incidentally, the contact hole CH2 and the recombination promoting layer RCL are most preferably formed across the junction interface between the impurity region HPW and the impurity region NLD, but even if the contact hole CH2 and the recombination promoting layer RCL are formed only in a region slightly away from the junction interface, it is possible to suppress the decrease in the parasitic breakdown voltage BVceo to some extent.

That is, the contact hole CH2 and the recombination promoting layer RCL may be formed on the upper surface of the impurity region HPW at a position closer to the junction interface than the impurity region HNW. For the same purpose, the contact hole CH2 and the recombination promoting layer RCL may be formed on the upper surface of the impurity region NLD at a position closer to the junction interface than the drain region ND. In these cases, it is preferable that a distance between the contact hole CH2 and the junction interface and a distance between the recombination promoting layer RCL and the junction interface are 40 nm or less.

Second Embodiment

Figure 14:
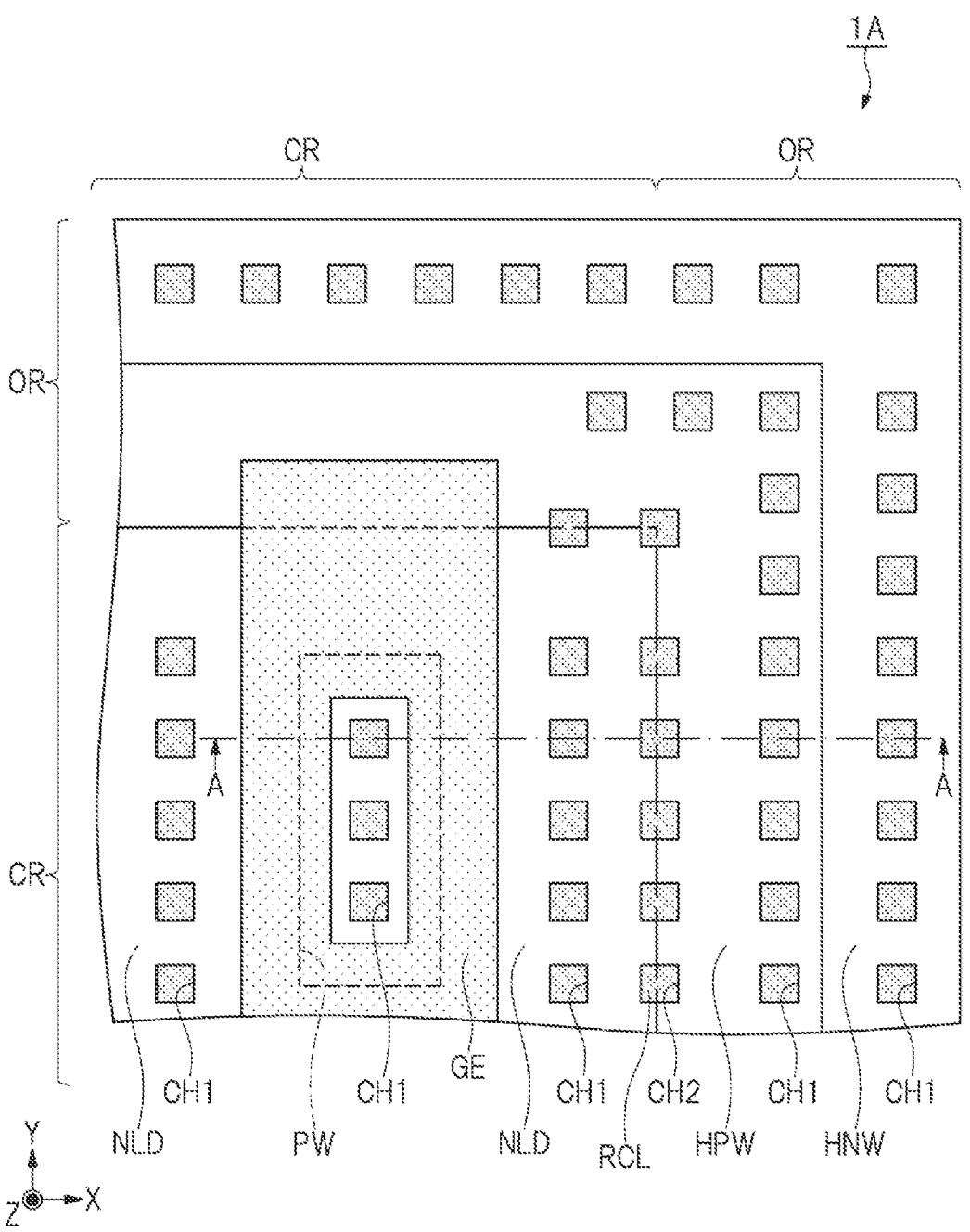
FIG. 14 is an enlarged plan view of a portion of a semiconductor device in a second embodiment.

The semiconductor device in the second embodiment will be described below with reference to FIG. 14. Note that, in the following description, differences from the first embodiment will be mainly described, and the description of overlapping points with the first embodiment will be omitted.

In the first embodiment, the contact hole CH2 is formed in a slit-like shape, but is divided into dot-shaped contact holes CH2 in the second embodiment. Accordingly, the recombination promoting layer RCL in the second embodiment is formed of crystal defect layers respectively formed at the bottom portions of the contact holes CH2. That is, the contact holes CH2 and the crystal defect layers are disposed along the junction interface between the impurity region HPW and the impurity region NLD while being spaced apart from each other in at least the Y direction, and are disposed while being spaced apart from each other in the X direction.

The contact holes CH2 in the second embodiment has the same shape as the contact holes CH1, and the diameter (width in the X direction and width in the Y direction) of the contact hole CH2 is, for example, 0.16 μm or more and 0.20 μm or less. The contact holes CH2 are formed by the same manufacturing step as the contact holes CH1.

In the second embodiment, the contact area between the semiconductor substrate SUB and the entire contact holes CH2 is smaller than in the first embodiment. That is, the area for forming the recombination promoting layers RCL is reduced. Therefore, as shown in FIG. 12, the first embodiment is superior to the second embodiment in suppressing the decrease in the parasitic breakdown voltage BVceo. However, even in the second embodiment, it is possible to sufficiently suppress the decrease in the parasitic breakdown voltage BVceo as compared with the second examined example.

However, in the second embodiment, since the contact holes CH2 have the same shapes as the contact holes CH1, a defect such as a shape defect of the contact holes CH2 is less likely to occur in the second embodiment than the first embodiment, and thus the semiconductor device can be stably manufactured.

Third Embodiment

The semiconductor device in the third embodiment will be described below with reference to FIGS. 15 and 16. Note that, in the following description, differences from the first embodiment will be mainly described, and the description of overlapping points with the first embodiment will be omitted.

In the first embodiment, the recombination promoting layer RCL is formed in the process of forming the contact hole CH2, and the dummy plug DPG is formed in the contact hole CH2. However, in the third embodiment, the contact hole CH2 and the dummy plug DPG are not formed.

Figure 15:
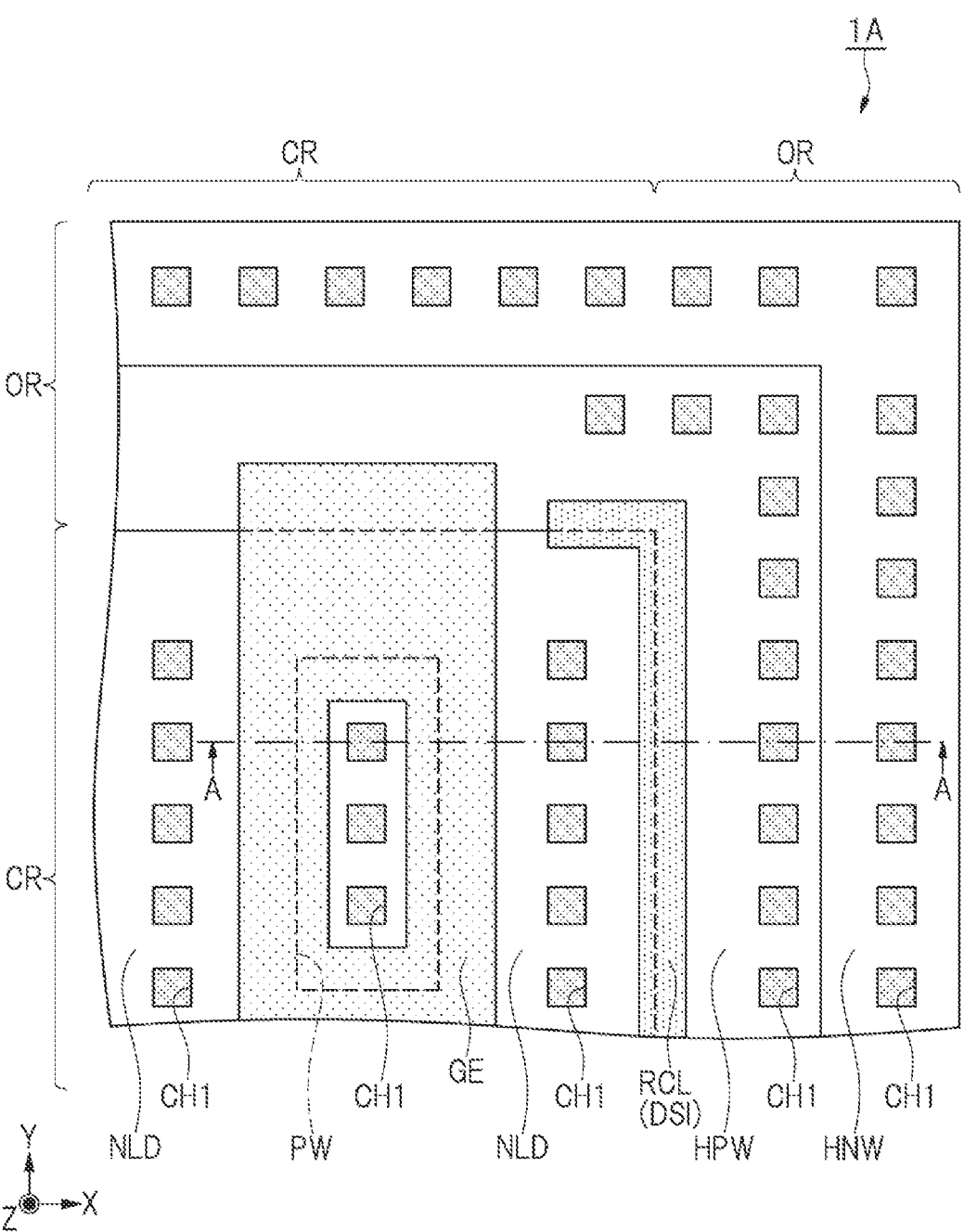
FIG. 15 is an enlarged plan view of a portion of a semiconductor device in a third embodiment.
Figure 16:
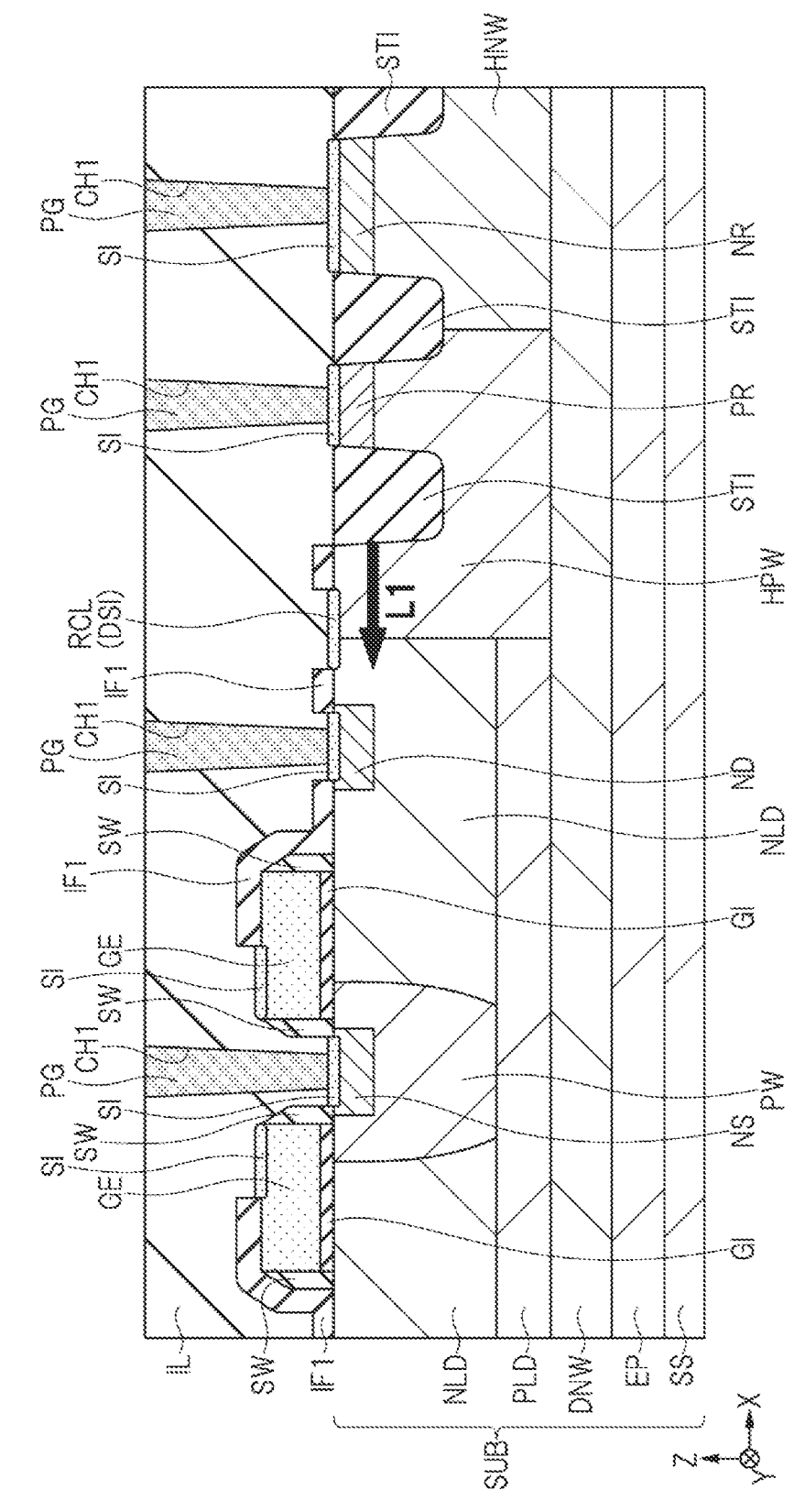
FIG. 16 is a cross-sectional view showing the semiconductor device in the third embodiment.

As shown in FIGS. 15 and 16, in the third embodiment, a dummy silicide film DSI is formed on the upper surface of each of the impurity region HPW and the impurity region NLD so as to be across the junction interface between the impurity region HPW and the impurity region NLD. The dummy silicide film DSI acts as a midgap level and functions as the recombination promoting layer RCL. The recombination promoting layer RCL (silicide film SI) extends at least in the Y direction and also in the X direction along the junction interface, similarly to the first embodiment.

In order to form the dummy silicide film DSI, in the manufacturing step of FIG. 10, a pattern opening the periphery of the junction interface is provided in the dielectric film IF1. Thereafter, the dummy silicide film DSI is formed as the recombination promoting layer RCL by the same step as the step of forming the other silicide film SI. Therefore, the recombination promoting layer RCL in the third embodiment is formed of the same material as the other silicide film SI.

In addition, in the third embodiment, the width of the recombination promoting layer RCL is more easily designed than in the first embodiment. In the first embodiment, the width of the recombination promoting layer RCL depends on the width of the contact hole CH2 and is substantially the same as the width of the contact hole CH1, and is, for example, 0.16 μm or more and 0.20 μm or less. In the third embodiment, it is easy to make the width of the recombination promoting layer RCL (the width of the dummy silicide film DSI) larger than the width of the contact hole CH1. Therefore, it is easy to further suppress the decrease in the parasitic breakdown voltage BVceo. The width of the recombination promoting layer RCL is a width in a direction orthogonal to the extending direction of the recombination promoting layer RCL (dummy silicide film DSI).

Figure 17:
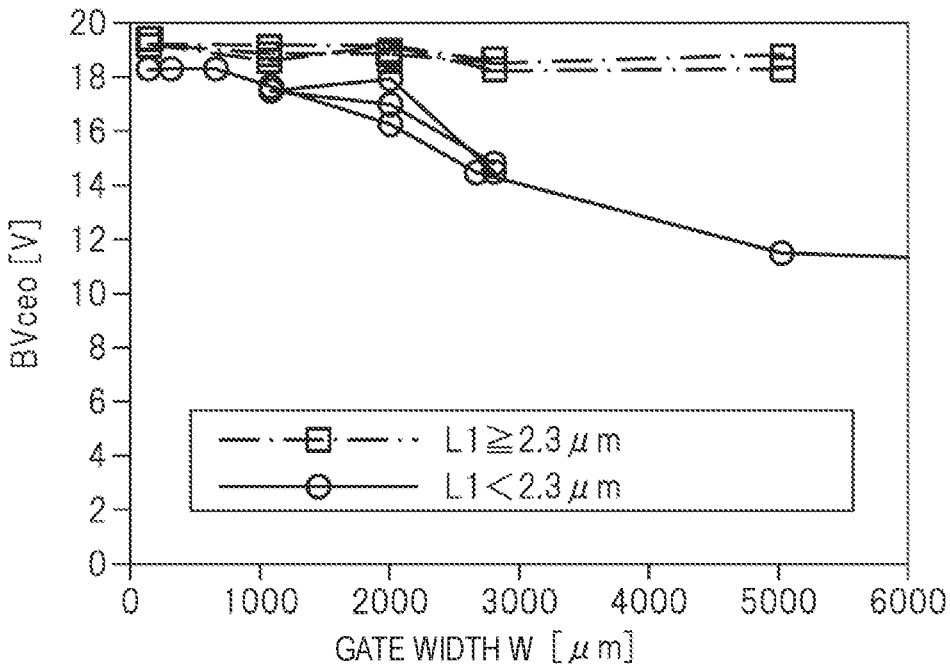
FIG. 17 is a graph showing a data of experiments conducted by the present inventors.

FIG. 17 shows how the parasitic breakdown voltage BVceo varies depending on the magnitude of the width L1 of the recombination promoting layer RCL. Note that the width L1 indicates the width of the recombination promoting layer RCL formed from the end portion of the element isolation portion STI toward the impurity region NLD.

As shown in FIG. 17, it can be seen that the reduction in the parasitic breakdown voltage BVceo is suppressed over the vicinity of the width L1 of 2.3 μm. That is, when the recombination promoting layer RCL approaches the junction interface and the region where the recombination promoting layer RCL and the depletion layer IVL overlap with each other increases, it can be seen that the decrease in the parasitic breakdown voltage BVceo is suppressed. In the experiment of FIG. 17, the width of the dummy silicide film STI is gradually increased from the end portion of the element isolation portion STI, but the dummy silicide film DSI need not to contact the end portion of the element isolation portion STI, and may be formed around the junction interface (around the depletion layer IVL).

Note that even in the third embodiment, the recombination promoting layer RCL is provided so that the recombination current easily flows as an off-leakage current. As described above, in the third embodiment, it is easy to make the width of the recombination promoting layer RCL larger than the width of the contact hole CH2 in the first embodiment. However, the width of the recombination promoting layer RCL is preferably set appropriately because the off-leakage current is increased accordingly.

In the third embodiment, as in the second embodiment, the recombination promoting layer RCL may be formed of the dummy silicide films DSI. In such case, if opening patterns are provided in the dielectric film IF1 along the junction interface, the dummy silicide films DSI can be formed in the opening patterns. That is, the dummy silicide films DSI may be disposed along the junction interface while being spaced apart from each other at least in the Y direction, and may be disposed while being spaced apart from each other also in the X direction.

Fourth Embodiment

Figure 18:
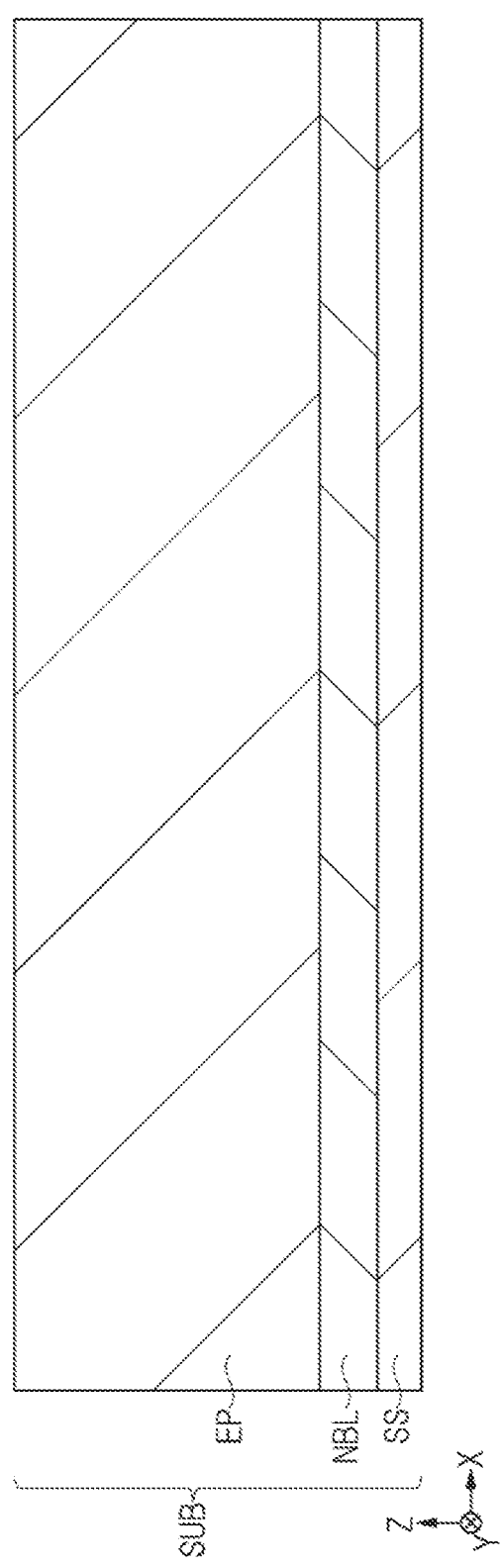
FIG. 18 is a cross-sectional view showing a manufacturing step of a semiconductor device in a fourth embodiment.
Figure 19:
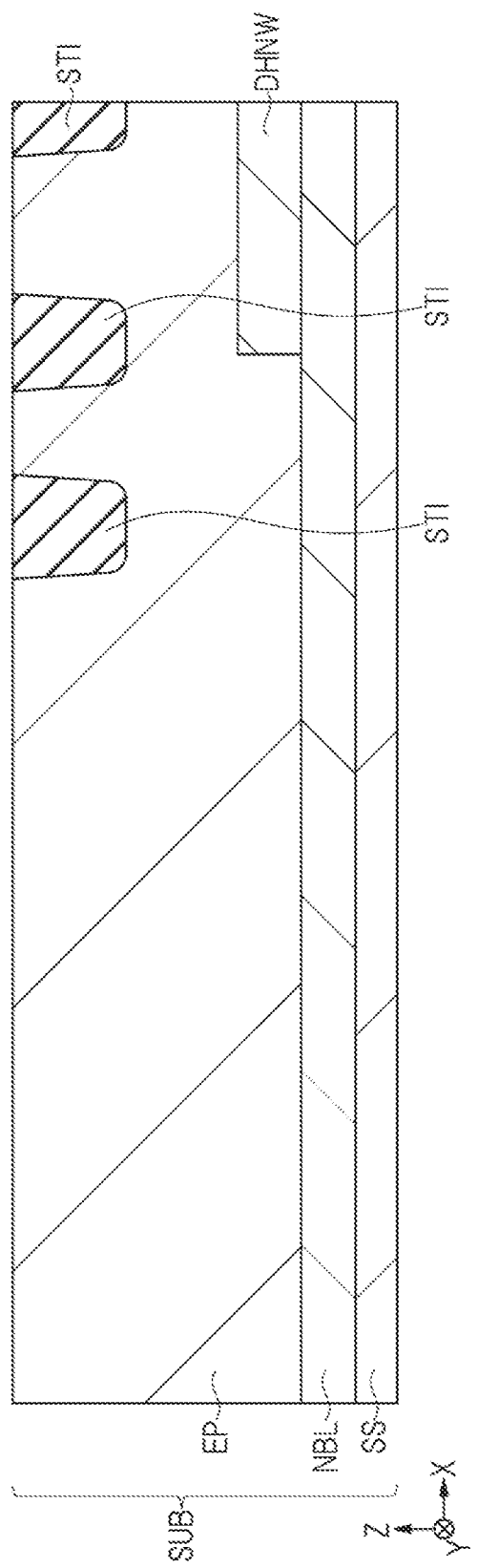
FIG. 19 is a cross-sectional view showing a manufacturing step subsequent to FIG. 18.
Figure 20:
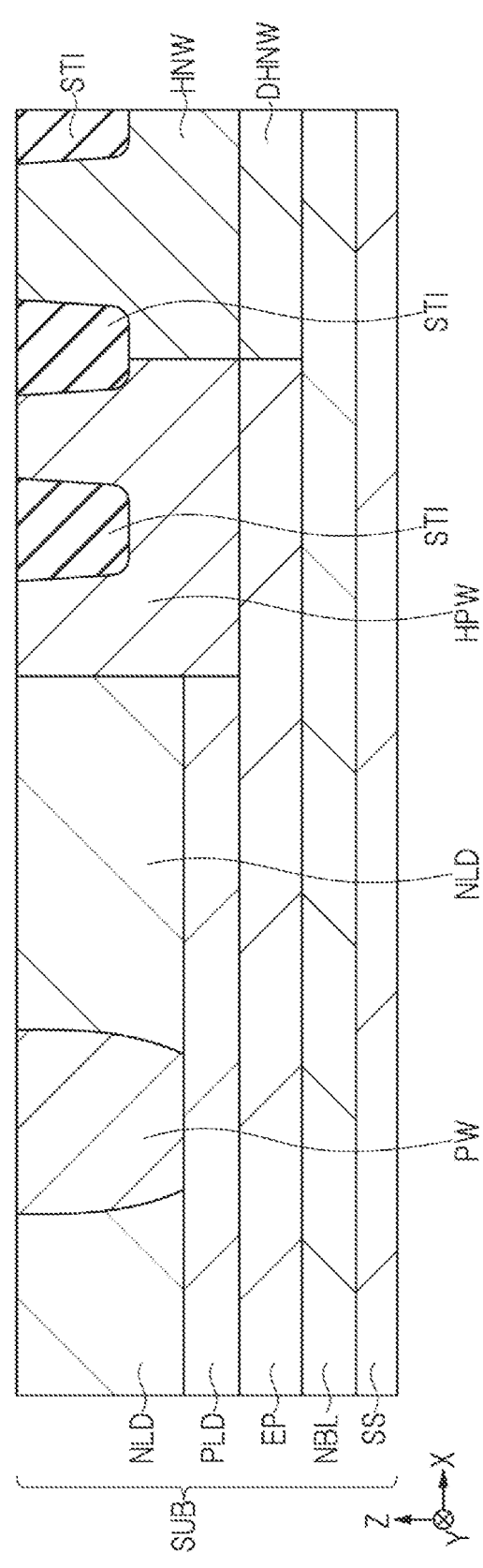
FIG. 20 is a cross-sectional view showing a manufacturing step subsequent to FIG. 19.

The semiconductor device in the fourth embodiment will be described below with reference to FIGS. 18 to 20. Note that, in the following description, differences from the first embodiment will be mainly described, and the description of overlapping points with the first embodiment will be omitted. FIGS. 18 to 20 show respective manufacturing steps corresponding to FIGS. 5 to 7.

In the first embodiment, the n-type impurity region DNW is used as a structure for electrically isolating the semiconductor elements. In the fourth embodiment, an n-type impurity region NBL is applied as a structure corresponding to the n-type impurity region DNW.

As shown in FIG. 18, the p-type support substrate SS is first prepared. Next, in the cell region CR and the peripheral region OR, the n-type impurity region NBL is formed in the support substrate SS by the photolithography technique and an ion-implantation method. Next, the p-type semiconductor layer EP is formed on the support substrate SS by the epitaxial growth method. As a result, the semiconductor substrate SUB that is a laminated body of the support substrate SS and the semiconductor layer EP is formed.

In the first embodiment, the semiconductor layer EP is formed first, and then the impurity region DNW is formed in the semiconductor layer EP by the ion-implantation method. Since the impurity region DNW need to be formed within the range in which the ion-implantation reaches, it is difficult to increase the thickness of the semiconductor layer EP. As shown in the fourth embodiment, by forming the impurity region NBL on the support substrate SS by the ion-implantation method first, and then forming the semiconductor layer EP, the thickness of the semiconductor layer EP can be increased. Therefore, in the fourth embodiment, the manufacturing cost is increased as compared with the first embodiment, but there are advantages such as an improvement in the breakdown voltage and an improvement in the noise-resistance.

The impurity region DNW in the first embodiment is located at a depth of about 2.0 μm to 3.0 μm from the upper surface of the semiconductor substrate SUB, while the impurity region NBL in the fourth embodiment is located at a depth of about 6.0 μm to 12.0 μm from the upper surface of the semiconductor substrate SUB. The impurity concentration of the impurity region DNW in the first embodiment is, for example, $1\times10^{16}$ cm$^{-3}$ to $1\times10^{17}$ cm$^{-3}$, while the impurity concentration of the impurity region NBL in the fourth embodiment is, for example, $1\times10^{17}$ cm$^{-3}$ to $1\times10^{18}$ cm$^{-3}$.

Next, as shown in FIG. 19, the element isolation portion STI is formed in the peripheral region OR, and an n-type impurity region DHNW is formed in the semiconductor substrate SUB by the photolithography technique and the ion-implantation method. The impurity region DHNW is formed as a part of the impurity region HNW to be described later, and serves to electrically conduct the impurity region NBL and the impurity region HNW. The impurity concentration of the impurity region DHNW is, for example, $1\times10^{16}$ cm$^{-3}$ to $1\times10^{17}$ cm$^{-3}$.

Thereafter, as shown in FIG. 20, the impurity region HPW, the impurity region HNW, the impurity region PLD, the impurity region NLD, and the impurity region PW are formed by a method similar to that of first embodiment. The subsequent manufacturing step is the same as the manufacturing step of FIG. 8 and subsequent steps.

Note that the technique described in the fourth embodiment is also applicable to the second embodiment and the third embodiment.

Although the present invention has been described in detail based on the embodiments, the present invention is not limited to these embodiments and can be variously modified without departing from the gist thereof.

What is claimed is:

1. A semiconductor device including a cell region in which Metal Insulator Semiconductor Field Effect Transistors (MISFETs) are formed and a peripheral region surrounding the cell region in a plan view, comprising:
   a first impurity region of a first conductivity type formed in a semiconductor substrate in the cell region and the peripheral region;

an element isolation portion formed in the semiconductor substrate from an upper surface of the semiconductor substrate to a predetermined depth in the peripheral region so as to surround the cell region in the plan view;

a second impurity region of a second conductivity type opposite to the first conductivity type formed in the semiconductor substrate from the upper surface of the semiconductor substrate to a position deeper than the element isolation portion in the peripheral region so as to surround the cell region in the plan view;

a third impurity region of the first conductivity type formed in the semiconductor substrate from the upper surface of the semiconductor substrate to the first impurity region in the peripheral region so as to surround the second impurity region in the plan view;

a fourth impurity region of the second conductivity type formed in the semiconductor substrate in the cell region so as to contact the second impurity region and located on the first impurity region; and a fifth impurity region of the first conductivity type formed in the semiconductor substrate from the upper surface of the semiconductor substrate to the fourth impurity region in the cell region so as to contact the second impurity region, wherein the element isolation portion includes a trench formed in the semiconductor substrate and a dielectric film buried in the trench, and wherein the element isolation portion is located in the second impurity region and spaced apart from a junction interface between the second impurity region and the fifth impurity region.

2. The semiconductor device according to claim 1, wherein a recombination promoting layer for recombination of electrons and holes is formed in an upper surface of each of the second impurity region and the fifth impurity region and across the junction interface.

3. The semiconductor device according to claim 2, wherein each of the MISFETs includes:

a sixth impurity region of the second conductivity type formed in the semiconductor substrate from the upper surface of the semiconductor substrate to the fourth impurity region in the cell region;

a source region of the first conductivity type formed in the sixth impurity region;

a drain region of the first conductivity type formed in the fifth impurity region; and a gate electrode formed on the sixth impurity region and the fifth impurity region via a gate dielectric film, and wherein, in a first direction in the plan view, a total value of a gate width of the gate electrode of each of the MISFETs is 1000 μm or more.

4. The semiconductor device according to claim 3, comprising:

an interlayer dielectric film formed on the upper surface of the semiconductor substrate in the cell region and the peripheral region;

a contact hole formed in the interlayer dielectric film and reaching the semiconductor substrate; and a plug formed in the contact hole, wherein the recombination promoting layer is a crystal defect layer formed on the upper surface of the semiconductor substrate located at a bottom portion of the contact hole, and wherein the contact hole and the crystal defect layer extend at least in the first direction along the junction interface.

5. The semiconductor device according to claim 3, comprising:

an interlayer dielectric film formed on the upper surface of the semiconductor substrate in the cell region and the peripheral region;

contact holes formed in the interlayer dielectric film and reaching the semiconductor substrate; and plugs formed in the contact holes, wherein the recombination promoting layer is formed of crystal defect layers formed at bottom portions of the contact holes, and wherein the contact holes and the crystal defect layers are disposed at least in the first direction along the junction interface and spaced apart from each other.

6. The semiconductor device according to claim 3, wherein the recombination promoting layer is formed of a silicide film, and wherein the silicide film extends at least in the first direction along the junction interface.

7. The semiconductor device according to claim 6, wherein the silicide film is a cobalt silicide film, a nickel silicide film or a nickel platinum silicide film.

8. The semiconductor device according to claim 6, an interlayer dielectric film formed on the upper surface of the semiconductor substrate in the cell region and the peripheral region;

a first contact hole formed in the interlayer dielectric film and located on the source region or the drain region; and a first plug formed in the first contact hole and electrically connected to the source region or the drain region, wherein, in a second direction intersecting with the first direction in the plan view, a width of the silicide film is larger than a width of the first contact hole.

9. A method of manufacturing a semiconductor device including a cell region in which Metal Insulator Semiconductor Field Effect Transistors (MISFETs) are formed and a peripheral region surrounding the cell region in a plan view, the method comprising:

(a) forming a first impurity region of a first conductivity type in a semiconductor substrate in the cell region and the peripheral region;

(b) forming an element isolation portion in the semiconductor substrate from an upper surface of the semiconductor substrate to a predetermined depth in the peripheral region so as to surround the cell region in the plan view;

(c) forming a second impurity region of a second conductivity type opposite to the first conductivity type in the semiconductor substrate from the upper surface of the semiconductor substrate to a position deeper than the element isolation portion in the peripheral region so as to surround the cell region in the plan view;

(d) forming a third impurity region of the first conductivity type in the semiconductor substrate from the upper surface of the semiconductor substrate to the first impurity region in the peripheral region so as to surround the second impurity region in the plan view;

(e) forming a fourth impurity region of the second conductivity type in the semiconductor substrate in the cell region so as to contact the second impurity region and located on the first impurity region; and (f) forming a fifth impurity region of the first conductivity type in the semiconductor substrate from the upper surface of the semiconductor substrate to the fourth impurity region in the cell region so as to contact the second impurity region, wherein the element isolation portion includes a trench formed in the semiconductor substrate and a dielectric film buried in the trench, and wherein the element isolation portion is located in the second impurity region and spaced apart from a junction interface between the second impurity region and the fifth impurity region.

10. The method according to claim 9, wherein a recombination promoting layer for recombination of electrons and holes is formed in an upper surface of each of the second impurity region and the fifth impurity region and across the junction interface.

11. The method according to claim 10, comprising:
(g) forming a sixth impurity region of the second conductivity type in the semiconductor substrate from the upper surface of the semiconductor substrate to the fourth impurity region in the cell region;
(h) forming a gate dielectric film on the sixth impurity region and the fifth impurity region;
(i) forming a gate electrode on the sixth impurity region and the fifth impurity region via the gate dielectric film;
(j) forming a source region of the first conductivity type in the sixth impurity region; and
(k) forming a drain region of the first conductivity type in the fifth impurity region,
wherein, in a first direction in the plan view, a total value of a gate width of the gate electrode of each of the MISFETs is 1000 μm or more.

12. The method according to claim 11, comprising:
(m) forming an interlayer dielectric film on the upper surface of the semiconductor substrate in the cell region and the peripheral region;
(n) forming a contact hole reaching the semiconductor substrate in the interlayer dielectric film by a plasma etching process; and
(o) forming a plug in the contact hole,
wherein the recombination promoting layer is a crystal defect layer formed on the upper surface of the semiconductor substrate located at a bottom portion of the contact hole by the plasma etching process, and
wherein the contact hole and the crystal defect layer extend at least in the first direction along the junction interface.

13. The method according to claim 11, comprising:
(m) forming an interlayer dielectric film on the upper surface of the semiconductor substrate in the cell region and the peripheral region;
(n) forming contact holes reaching the semiconductor substrate in the interlayer dielectric film by a plasma etching process; and
(o) forming plugs formed in the contact holes,
wherein the recombination promoting layer is formed of crystal defect layers formed on the upper surface of the semiconductor substrate located at bottom portions of the contact holes by the plasma etching process, and
wherein the contact holes and the crystal defect layers are disposed at least in the first direction along the junction interface and spaced apart from each other.

14. The method according to claim 11, comprising:
(p) forming a first dielectric film having a pattern opening a part of the upper surface of the semiconductor substrate on the upper surface of the semiconductor substrate; and
(q) forming a silicide film on the upper surface of the semiconductor substrate exposed from the first dielectric film,
wherein the recombination promoting layer is formed of a silicide film, and
wherein the silicide film extends at least in the first direction along the junction interface.

15. The method according to claim 14, wherein the silicide film is a cobalt silicide film, a nickel silicide film or a nickel platinum silicide film.

16. The method according to claim 14, comprising:
(m) forming an interlayer dielectric film on the upper surface of the semiconductor substrate in the cell region and the peripheral region;
(n) forming a first contact hole in the interlayer dielectric film so as to be located on the source region or the drain region by a plasma etching process; and
(o) forming a first plug in the first contact hole so as to be electrically connected to the source region or the drain region,
wherein, in a second direction intersecting with the first direction in the plan view, a width of the silicide film is larger than a width of the first contact hole.

17. The method according to claim 9, wherein the (a) includes:
(a1) preparing a support substrate;
(a2) forming a semiconductor layer on the support substrate by an epitaxial growth method, thereby forming the semiconductor substrate which is a laminated body of the support substrate and the semiconductor layer; and
(a3) forming the first impurity region in the semiconductor layer.

18. The method according to claim 9, wherein the (a) includes:
(a4) preparing a support substrate;
(a5) forming the first impurity region in the support substrate; and
(a6) forming a semiconductor layer on the support substrate by an epitaxial growth method, thereby forming the semiconductor substrate which is a laminated body of the support substrate and the semiconductor layer.

* * * * *